(12) United States Patent
Campbell et al.

(10) Patent No.: US 9,042,099 B2
(45) Date of Patent: May 26, 2015

(54) AIR-COOLING AND VAPOR-CONDENSING DOOR ASSEMBLY

(71) Applicant: INTERNATIONAL BUSINESS MACHINES CORPORATION, Armonk, NY (US)

(72) Inventors: Levi A. Campbell, Poughkeepsie, NY (US); Richard C. Chu, Hopewell Junction, NY (US); Milnes P. David, Fishkill, NY (US); Michael J. Ellsworth, Jr., Lagrangeville, NY (US); Madhusudan K. Iyengar, Foster City, CA (US); Roger R. Schmidt, Poughkeepsie, NY (US); Robert E. Simons, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 145 days.

(21) Appl. No.: 13/782,012

(22) Filed: Mar. 1, 2013

(65) Prior Publication Data
US 2014/0133099 A1 May 15, 2014

Related U.S. Application Data

(63) Continuation of application No. 13/674,207, filed on Nov. 12, 2012.

(51) Int. Cl.
*H05K 7/20* (2006.01)
*F28F 9/00* (2006.01)

(52) U.S. Cl.
CPC .............. *F28F 9/00* (2013.01); *H05K 7/20781* (2013.01)

(58) Field of Classification Search
USPC ....................... 361/676–678, 679.46–679.54, 361/688–722, 752, 760, 831
See application file for complete search history.

(56) References Cited

U.S. PATENT DOCUMENTS

| 4,010,489 A | 3/1977 | Bourbeau et al. |
| 6,552,901 B2 | 4/2003 | Hildebrant |

(Continued)

OTHER PUBLICATIONS

Campbell et al., "Air-Cooling and Vapor-Condensing Door Assembly", U.S. Appl. No. 13/674,207, filed Nov. 12, 2012.

(Continued)

*Primary Examiner* — Courtney Smith
(74) *Attorney, Agent, or Firm* — Steven Chiu, Esq.; Kevin P. Radigan, Esq.; Heslin Rothenberg Farley & Mesiti P.C.

(57) ABSTRACT

A method is provided which includes providing a cooling apparatus which includes a door assembly coupled to the electronics rack at an inlet or air outlet side of the rack. The door assembly includes: an airflow opening configured to facilitate ingress or egress of airflow through the electronics rack with the door assembly mounted to the rack; an air-to-coolant heat exchanger disposed so that airflow through the airflow opening passes across the air-to-coolant heat exchanger, the air-to-coolant heat exchanger being configured to extract heat from the airflow passing thereacross; and a vapor condenser configured to facilitate condensing of dielectric fluid vapor egressing from at least one immersion-cooled electronic component section of the electronics rack. The cooling apparatus, including the door assembly, facilitates air-cooling and immersion-cooling of different electronic components of the electronics rack.

10 Claims, 16 Drawing Sheets

(56) References Cited

U.S. PATENT DOCUMENTS

| | | | |
|---|---|---|---|
| 7,385,810 B2 | 6/2008 | Chu et al. | |
| 7,450,385 B1* | 11/2008 | Campbell et al. | 361/699 |
| 7,679,909 B2 | 3/2010 | Spearing et al. | |
| 7,746,634 B2 | 6/2010 | Hom et al. | |
| 7,895,854 B2 | 3/2011 | Bash et al. | |
| 8,113,009 B2 | 2/2012 | Kuriyama et al. | |
| 8,144,467 B2 | 3/2012 | Campbell et al. | |
| 8,351,206 B2* | 1/2013 | Campbell et al. | 361/700 |
| 2003/0085025 A1 | 5/2003 | Woods et al. | |
| 2006/0026983 A1* | 2/2006 | Tilton et al. | 62/310 |
| 2010/0305775 A1 | 12/2010 | Bean, Jr. et al. | |
| 2011/0051372 A1* | 3/2011 | Barringer et al. | 361/701 |
| 2011/0056675 A1 | 3/2011 | Barringer et al. | |
| 2011/0232889 A1 | 9/2011 | Eckberg et al. | |
| 2011/0315353 A1* | 12/2011 | Campbell et al. | 165/104.31 |
| 2013/0105122 A1* | 5/2013 | Campbell et al. | 165/104.26 |
| 2014/0133096 A1 | 5/2014 | Campbell et al. | |

OTHER PUBLICATIONS

Campbell et al., Office Action for U.S. Appl. No. 13/674,207, filed Nov. 12, 2012 (U.S. Patent Publication No. 2014/0133096 A1), dated Sep. 24, 2014 (11 pages).

* cited by examiner

US 9,042,099 B2

AIR-COOLING AND VAPOR-CONDENSING DOOR ASSEMBLY

CROSS-REFERENCE TO RELATED APPLICATION

This application is a continuation of U.S. Ser. No. 13/674,207, filed Nov. 12, 2012, and entitled "Air-Cooling and Vapor-Condensing Door Assembly", and which is hereby incorporated herein by reference in its entirety.

BACKGROUND

The power dissipation of integrated circuit chips, and the modules containing the chips, continues to increase in order to achieve increases in processor performance. This trend poses a cooling challenge at both module and system levels. Increased airflow rates are needed to effectively cool high-powered modules, and to limit the temperature of the air that is exhausted into the computer center.

In many large server applications, processors, along with their associated electronics (e.g., memory, disk drives, power supplies, etc.), are packaged in removable drawer configurations stacked within a rack or frame. In other cases, the electronics may be in fixed locations within the rack or frame. Typically, the components are cooled by air moving in parallel airflow paths, usually front-to-back, impelled by one or more air-moving devices (e.g., fans or blowers). In some cases, it may be possible to handle increased power dissipation within a single drawer by providing greater airflow, through the use of a more powerful air-moving device, or by increasing the rotational speed (i.e., RPMs) of an existing air-moving device.

The sensible heat load carried by the air exiting the rack is stressing the capability of the room air-conditioning to effectively handle the load. This is especially true for large installations with "server farms", or large banks of computer racks close together. In such installations, liquid-cooling (e.g., water-cooling) is an attractive technology to manage the higher heat fluxes. The liquid absorbs the heat dissipated by the components/modules in an efficient manner. Typically, the heat is ultimately transferred from the liquid to an outside environment.

BRIEF SUMMARY

In one aspect, certain shortcomings of the prior art are overcome and additional advantages are provided through a method which includes: providing a cooling apparatus comprising a door assembly configured to couple to an electronics rack and be disposed at one of an air inlet side or an air outlet side of the electronics rack, wherein air moves through the electronics rack from the air inlet side to the air outlet side thereof, and wherein the door assembly includes: an airflow opening facilitating ingress or egress of airflow through the electronics rack with the door assembly mounted thereto; and air-to-coolant heat exchanger disposed so that airflow through the airflow opening passes across the air-to-coolant heat exchanger, the air-to-coolant heat exchanger configured to extract heat from the airflow passing thereacross; and a vapor condenser unit configured to facilitate condensing of dielectric fluid vapor egressing from the at least one immersion-cooled electronic component section of the electronics rack.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
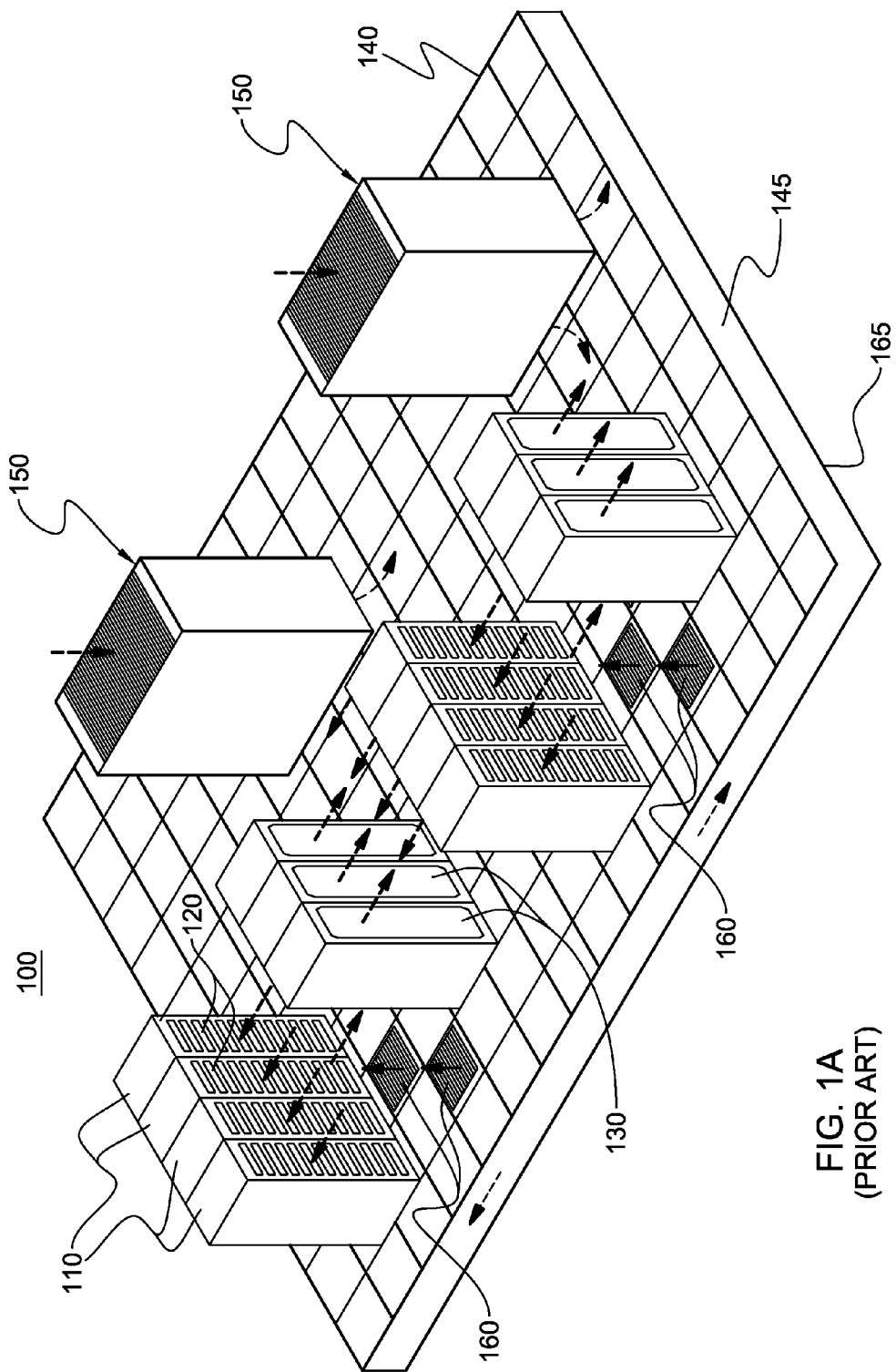
FIG. 1A depicts one embodiment of a conventional raised floor layout of a computer installation comprising multiple electronics racks.

As used herein, the terms "electronics rack", "rack unit", and "rack" are used interchangeably, and unless otherwise specified, include any housing, frame, support structure, compartment, blade server system, etc., having one or more heat generating components of a computer system or electronic system, and may be, for example, a stand-alone computer processor having high, mid or low end processing capability. In one embodiment, an electronics rack may comprise a portion of an electronic system, a single electronic system, or multiple electronic systems, for example, in one or more sub-housings, blades, books, drawers, nodes, compartments, etc., having one or more heat-generating electronic components disposed therein. An electronic system within an electronics rack may be movable or fixed relative to the electronics rack, with the rack-mounted electronic drawers of a multi-drawer rack unit and blades of a blade center system being two examples of systems (or subsystems) of an electronics rack to be cooled.

Further, as used herein, "air-to-coolant heat exchanger" means any heat exchange mechanism characterized as described herein through which coolant can circulate; and includes, one or more discrete air-to-coolant heat exchangers coupled either in series or in parallel. An air-to-coolant heat exchanger may comprise, for example, one or more coolant flow paths, formed of thermally conductive tubings (such as copper or other tubing) in thermal or mechanical contact with a plurality of air-cooled cooling fins (such as aluminum or other fins). Unless otherwise specified, size, configuration and construction of the air-to-coolant heat exchanger can vary without departing from the scope of the invention disclosed herein. A "liquid-to-liquid heat exchanger" may comprise, for example, two or more coolant flow paths, formed of thermally conductive tubings (such as copper or other tubing) in thermal or mechanical contact with each other to facilitate conduction of heat therebetween. Size, configuration and construction of the liquid-to-liquid heat exchanger can vary without departing from the scope of the invention disclosed herein. Further, as used herein, "data center" refers to a computer installation containing one or more electronics racks, and as a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, and unless otherwise specified, one or more of the coolants may comprise a water-glycol mixture, a brine, a fluorocarbon liquid, a liquid metal, or other similar coolant, or a refrigerant, while still maintaining the advantages and unique features of the present invention. Further, the term "coolant" refers to any liquid or gas, or combination thereof, used to remove heat, in accordance with the structures and concepts disclosed herein.

Reference is made below to the drawings (which are not drawn to scale to facilitate an understanding of the invention), wherein the same reference numbers used throughout different figures designate the same or similar components.

As shown in FIG. 1A, in a raised floor layout of an air cooled computer installation or data center 100, multiple electronics racks 110 may be disposed in one or more rows. A computer installation such as depicted in FIG. 1A may house several hundred, or even several thousand processors. In the arrangement of FIG. 1A, chilled air enters the computer room via floor vents from a supply air plenum 145 defined between a raised floor 140 and a base or sub-floor 165 of the room. Cooled air is taken in through louvered covers at the front, or air inlet sides 120, of the electronics racks and expelled through the back, or air outlet sides 130, of the electronics racks. Each electronics rack 110 may have one or more air-moving devices (e.g., fans or blowers) to provide forced inlet-to-outlet airflow to cool the electronic components within the rack. Supply air plenum 145 provides conditioned and cooled air to the air-inlet sides of the electronics racks via perforated floor tiles 160 disposed (in one embodiment) in a "cold" air aisle of the data center. The conditioned and cooled air is supplied to plenum 145 by one or more air-conditioning units 150, which may also be disposed within data center 100. Room air is taken into each air-conditioning unit 150 near an upper portion thereof. In the depicted embodiment, this room air comprises in part exhausted air from the "hot" air aisles of the data center defined by opposing air outlet sides 130 of the electronics racks 110.

Figure 1B:
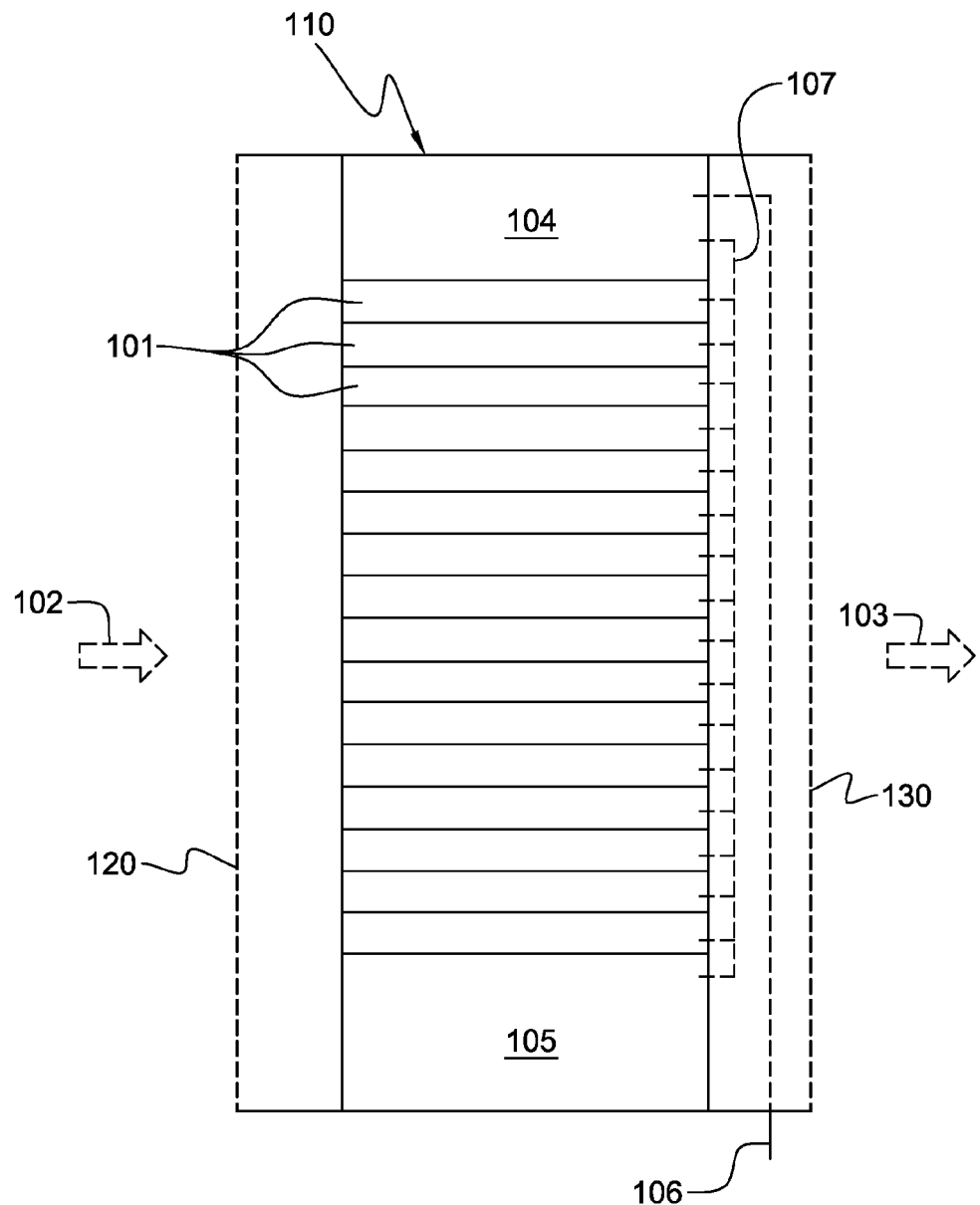
FIG. 1B is an elevational schematic of one embodiment of an electronics rack comprising multiple electronic systems or subsystems to be cooled, in accordance with one or more aspects of the present invention.

FIG. 1B is an elevational representation of one embodiment of an electronics rack 110. In the embodiment shown, electronics rack 110 includes a plurality of electronic subsystems 101, which (in the embodiment illustrated) are air-cooled by cool air 102 ingressing via louvered air inlet side 120, and exhausting out louvered air outlet side 130 as hot air 103. Electronics rack 110 also includes (in one embodiment) at least one bulk power assembly 104. One or more electronic subsystems 101 include, in one example, one or more processors, associated memory, input/output adapters and disk storage devices. Also illustrated in FIG. 1B is an I/O and disk expansion subsystem 105, which includes, in one detailed example, PCIe card slots and disk drivers for one or more electronic subsystems of the electronics rack. Note that I/O and disk expansion subsystem 105 could be disposed anywhere within electronics rack 110, with the positioning shown in FIG. 1B being provided as one example only. For example, the I/O and disk expansion subsystem 105 could alternatively be disposed in the middle of the electronics rack, if desired.

In one rack example, a three-phase AC source feeds power via an AC power cord 106 to bulk power assembly 104, which transforms the supplied AC power to an appropriate DC power level for output via distribution cables 107 to the plurality of electronics subsystems 101. AC power cord 106 supplies, in one example, three phase electrical power. The number and type of electronic subsystems installed in the electronics rack are variable and depend on customer requirements for a particular system.

Due to ever increasing airflow requirements through electronics racks, and the limits of air distribution within the typical computer room installation, recirculation problems within the room may occur. Recirculation can occur because the conditioned air supplied through the floor tiles may only be a fraction of the airflow rate forced through the electronics racks by the air moving devices disposed within the racks. This can be due, for example, to limitations on the tile sizes (or diffuser flow rates). The remaining fraction of the supply of inlet side air may be made up by ambient room air through recirculation, for example, from the air outlet side of the rack unit to the air inlet side. This recirculating flow is often very complex in nature, and can lead to significantly higher rack inlet temperatures than might be expected.

Recirculation of hot exhaust air from the hot aisle of the computer room installation to the cold aisle can be detrimental to the performance and reliability of the computer system(s) or electronic system(s) within the rack(s). Data center equipment is typically designed to operate with rack air inlet temperatures in the 15-35° C. range. For a raised floor layout such as depicted in FIG. 1A, however, temperatures can range from 15-20° C. at the lower portion of the rack, close to the cool air floor vents, to as much as 32-42° C. at the upper portion of the electronics rack, where hot air can form a self-sustaining recirculation loop. Since the allowable rack heat load is limited by the rack inlet air temperature at the "hot" part, this temperature distribution correlates to an inefficient utilization of available air conditioning capability. Computer installation equipment almost always represents a high capital investment to the customer. Thus, it is of significant importance, from a product reliability and performance view point, and from a customer satisfaction and business perspective, to achieve a substantially uniform temperature across the air inlet side of the rack unit.

Figure 2A:
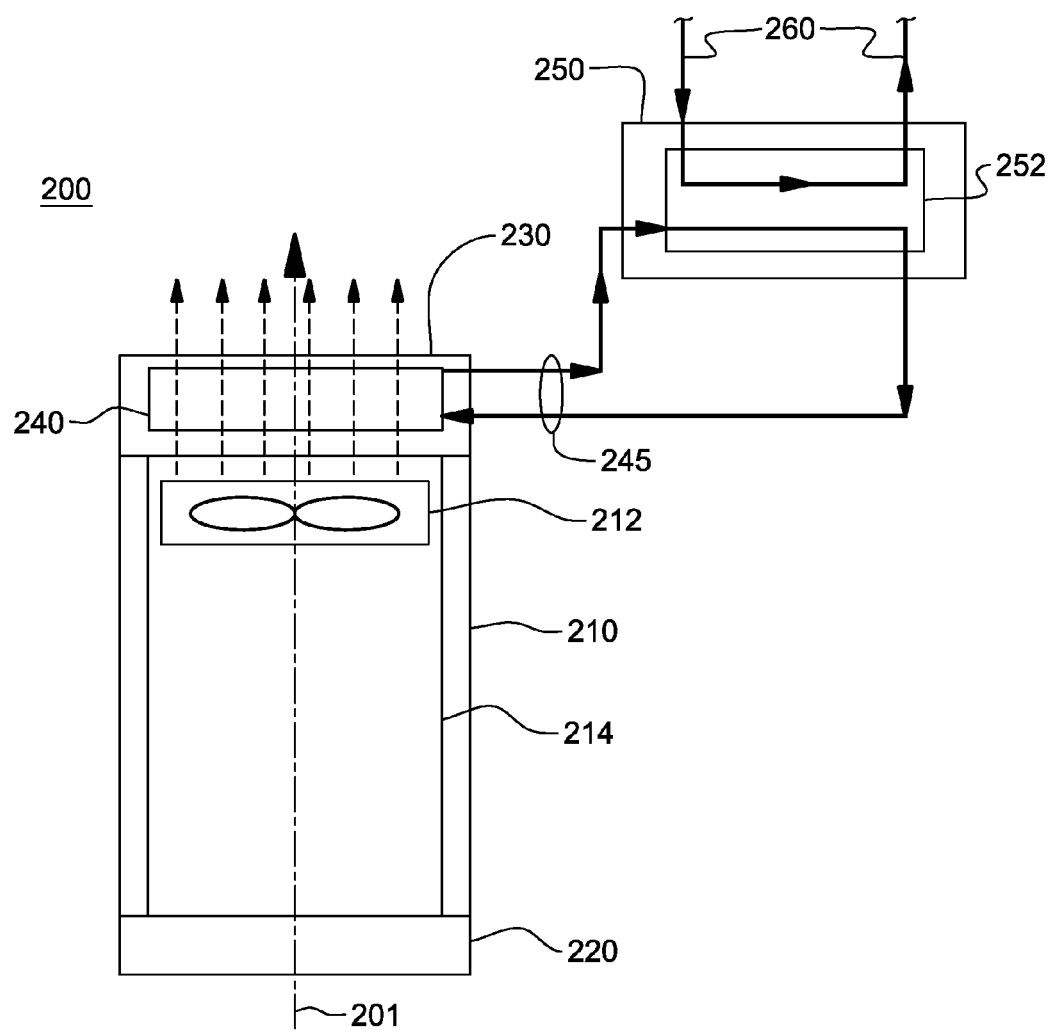
FIG. 2A is a top plan view of one embodiment of an electronics rack with a heat exchanger door mounted to an air outlet side thereof, and with extracted heat being rejected to facility coolant via a coolant distribution unit, in accordance with one or more aspects of the present invention.
Figure 2B:
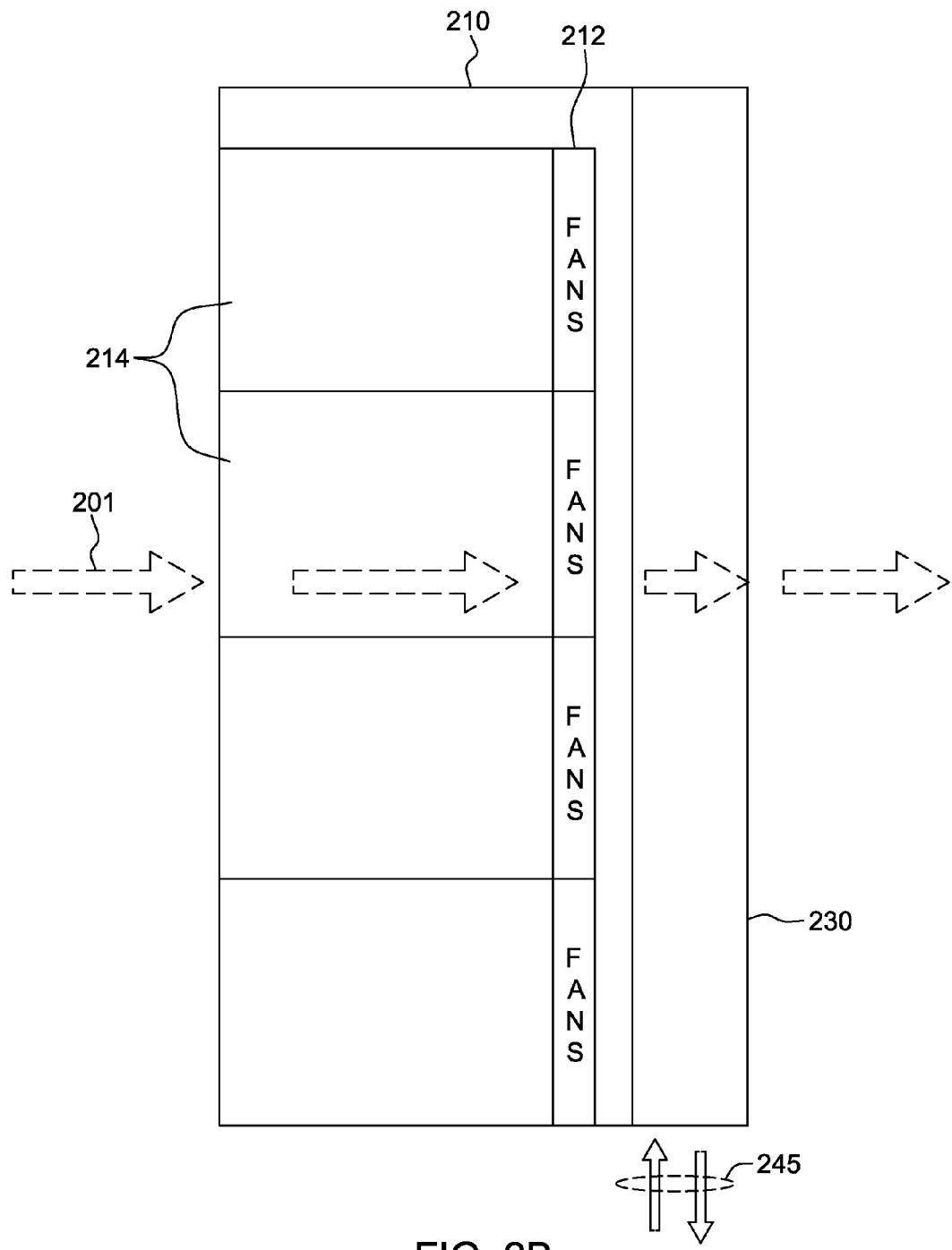
FIG. 2B is a side elevational view of the electronics rack and heat exchanger door of FIG. 2A, in accordance with one or more aspects of the present invention.

Referring collectively to FIGS. 2A & 2B, one embodiment of a cooled electronic system, generally denoted 200, is shown, which includes an electronics rack 210 having an inlet door 220 and an outlet door 230. The inlet and outlet doors have openings to allow for the ingress and egress of air 201, respectively, through the air inlet side and air outlet side of electronics rack 210. The system further includes at least one air-moving device 212 for moving air across at least one electronic system or component 214 disposed within the electronics rack. Located within outlet door 230 is an air-to-coolant heat exchanger 240 across which the inlet-to-outlet airflow 201 through the electronics rack passes. As shown in FIG. 2A, a system coolant loop 245 couples air-to-coolant heat exchanger 240 to a coolant distribution unit 250. Coolant distribution unit 250 is used to buffer the air-to-coolant heat exchanger from facility coolant in a facility coolant loop 260. Air-to-coolant heat exchanger 240 removes heat from the exhausted inlet-to-outlet airflow 201 through the electronics rack via circulating system coolant, for rejection in coolant distribution unit 250 to facility coolant in facility coolant loop 260, for example, via a coolant-to-liquid heat exchanger 252 disposed therein. By way of example, such a system is described in U.S. Pat. No. 7,385,810 B2, issued Jun. 10, 2008, and entitled "Apparatus and Method for Facilitating Cooling of an Electronics Rack Employing a Heat Exchange Assembly Mounted to an Outlet Door Cover of the Electronics Rack". This cooling apparatus can advantageously reduce heat load on the existing air-conditioning unit(s) within the data center, and facilitates cooling of electronics racks by cooling (in one embodiment) the air egressing from the electronics rack and thus cooling any air recirculating to the air inlet side thereof.

In one implementation, inlet and outlet coolant manifolds of the door-mounted, air-to-coolant heat exchanger are also mounted within the heat exchanger door and are coupled to coolant supply and return lines disposed, for example, beneath a raised floor. Alternatively, overhead system coolant supply and return lines might be provided for the air-to-coolant heat exchangers. In such an embodiment, system coolant would enter and exit the respective coolant inlet and outlet manifolds from the top of the rack door, for example, using flexible coolant supply and return hoses, which may be at least partially looped and sized to facilitate opening and closing of the heat exchanger door. Additionally, structures may be provided at the ends of the hoses to relive stress at the hose ends, which would result from opening or closing of the door.

Figure 3:
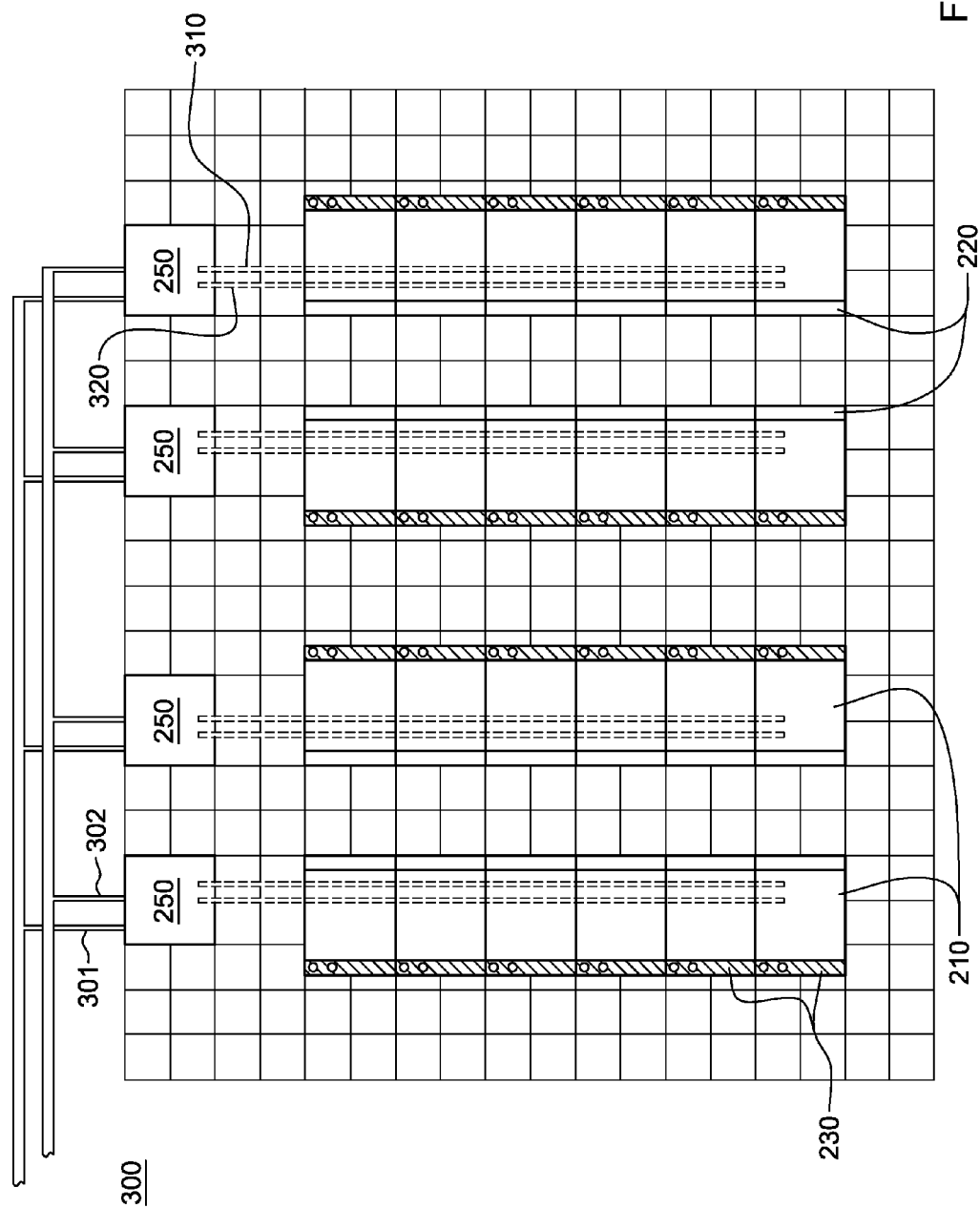
FIG. 3 depicts one embodiment of a data center layout comprising multiple coolant distribution units providing coolant to a plurality of electronics racks with air-cooling apparatuses mounted to at least one of the air inlet sides or air outlet sides thereof, in accordance with one or more aspects of the present invention.

FIG. 3 is a plan view of one embodiment of a data center, generally denoted 300, with cooled electronic systems comprising door-mounted, air-to-coolant heat exchangers, such as disclosed herein. Data center 300 includes a plurality of rows of electronics racks 210, each of which includes (by way of example only) an inlet door 220 at the air inlet side, and a hinged heat exchanger door 230 at the air outlet side, such as described above in connection with the embodiment of FIGS. 2A & 2B. In this embodiment, each heat exchanger door 230 comprises an air-to-coolant heat exchanger and system coolant inlet and outlet manifolds. Multiple coolant conditioning units 250, which function in part as coolant pumping units, are disposed within the data center, for instance, along with one or more air-conditioning units, such as shown in FIG. 1A. By way of example only, each pumping unit may form a system coolant distribution subsystem with one row of a plurality of electronics racks. Each pumping unit includes a coolant-to-liquid heat exchanger where heat is transferred from a system coolant loop to a facility coolant loop. In operation, chilled facility coolant, such as water, is received via a facility coolant supply line 301, and returned via a facility coolant return line 302. System coolant, such as water, is provided via a system coolant supply manifold 310 extending below the respective row of electronics racks, and is returned via a system coolant return manifold 320 also extending below the respective row of electronics racks. In one embodiment, the system coolant supply and return manifolds 310, 320 are hard-plumbed within the data center, for example, within an air supply plenum of the data center, and may be preconfigured to align under and include branch lines (or hoses) extending towards the electronics racks in a respective row of racks.

Figure 4:
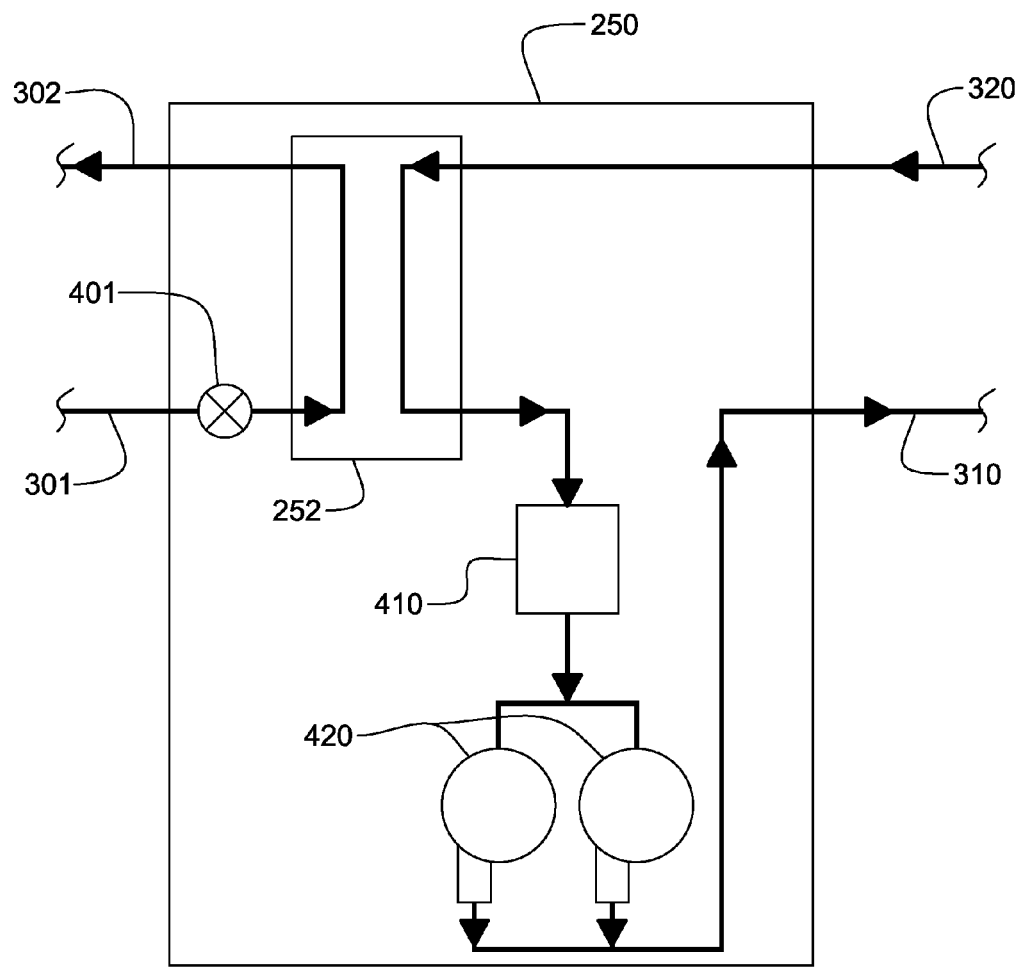
FIG. 4 is a schematic of one embodiment of a coolant distribution unit which may be employed (in one embodiment) in association with an air-cooling apparatus, or a hybrid air-cooling and vapor-condensing apparatus, in accordance with one or more aspects of the present invention.

FIG. 4 depicts one embodiment of a coolant distribution unit 250 for (for example) a data center such as depicted in FIG. 3. Liquid-to-liquid heat exchanger 252 cools system coolant passing through the system coolant loop (comprising system coolant supply header 310 and system coolant return header 320). In one embodiment, the system coolant has undergone heating within the respective air-to-liquid heat exchangers disposed within the outlet doors of the electronics racks. The facility coolant loop coupled to liquid-to-liquid heat exchanger 252 comprises facility coolant supply line 301 and facility coolant return line 302, which in one embodiment, provide chilled facility water to the liquid-to-liquid heat exchanger. A control valve 401 may be employed in facility coolant supply line 301 to control facility coolant flow rate through the liquid-to-liquid heat exchanger 252. After the system coolant cools within liquid-to-liquid heat exchanger 252, the coolant is collected in a reservoir 410 for pumping via a redundant pump assembly 420 back to the respective row of electronics racks via system coolant supply header 310.

Figure 5:
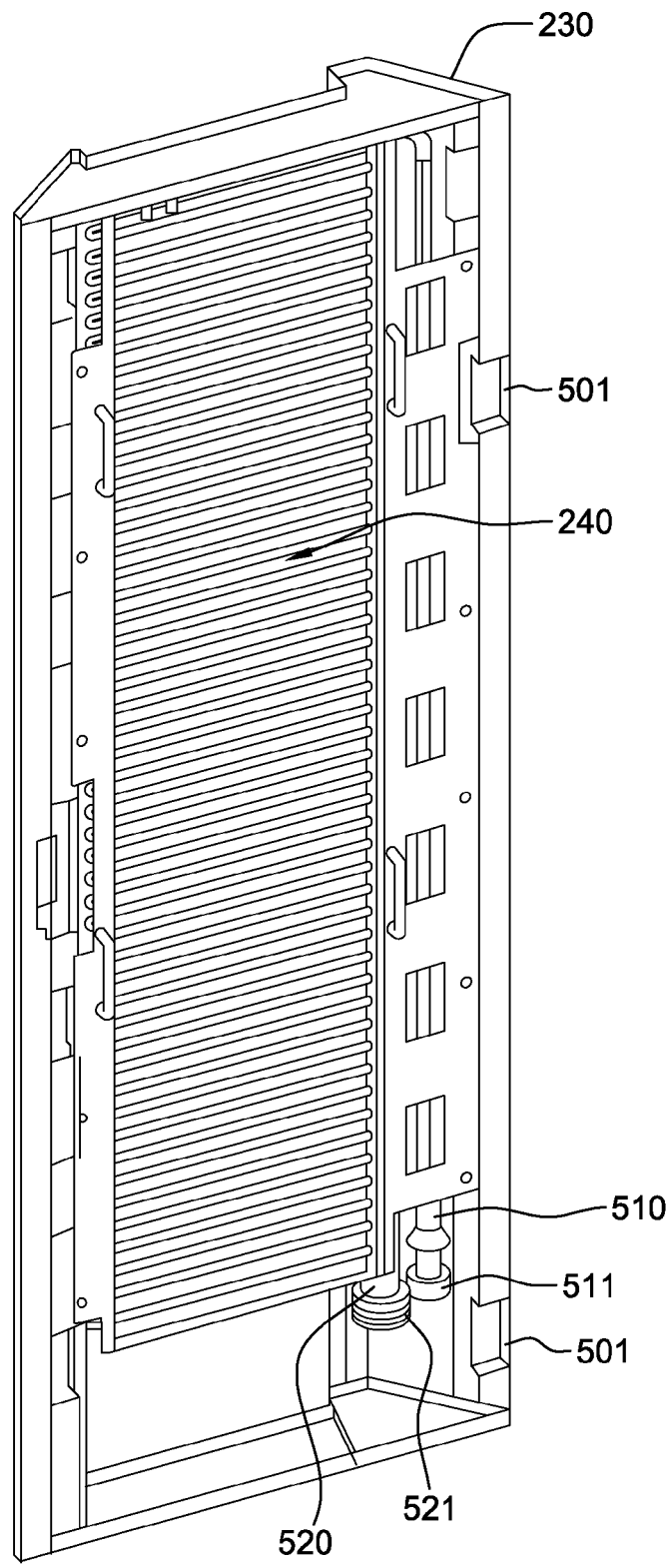
FIG. 5 depicts one implementation of a partially assembled heat exchanger door for, for instance, use with the electronics rack implementation of FIGS. 2A & 2B, in accordance with one or more aspects of the present invention.

FIG. 5 depicts one version of a heat exchanger door 230 for mounting to the air outlet side of an electronics rack, such as described above in connection with FIGS. 2A-3. This embodiment is described in detail in the above-noted U.S.

Pat. No. 7,385,810 B2, and represents one version of an outlet door 230 with an air-to-coolant heat exchanger 240 mounted therein. In this embodiment, a coolant inlet manifold 510 and coolant outlet manifold 520 are provided along a hinge edge 501, which is configured to facilitate hinged mounting of the outlet door to an electronics rack. The coolant inlet and outlet manifolds 510, 520 further include couplings, such as quick connect couplings 511, 521 within the outlet door that are aligned vertically with the coolant inlet and outlet manifolds.

A heat exchanger door, such as depicted in FIG. 5, comprises a cooling device, and replaces (for example) a door of an electronics rack. When incorporated as an outlet door, the heat exchanger door does not provide any direct cooling to the electronic components within the electronics rack, but rather facilitates a reduction in the exhaust air temperature into the data center that may re-circulate to the air inlet side, as well as reduces the heat load to be removed by, for example, the computer room air-conditioning units, and thus, facilitates management of the heat load within the data center. Depending on the implementation, since the temperature of air leaving the electronics rack via a heat exchanger door, such as disclosed herein, can be as cold as or colder than the air entering the electronics rack, usage of the heat exchanger door proposed herein may decrease or even eliminate the need for computer room air-conditioners within the data center.

Advantages of using a heat exchanger door, especially configured, such as disclosed herein, include: the ability to support a much higher power-rack load than can otherwise be supported by traditional air-cooling of the data center alone, which is generally limited to about 10-15 kW/rack for the majority of data centers; eliminates the uncomfortable hot aisle/cold aisle data center floor configuration; eliminates the need for hot aisle and/or cold aisle containment; has significant energy efficiency, that is, as compared with conventional air-cooling, where the typical air-cooled data center must pay for the electrical power used by the blowers and the computer room air-conditioner to force the chilled air under the floor and through the perforated tiles on the floor, to the inlet sides of the electronics racks; utilizes a coolant (such as water) which can result in a 4× to 10× reduction in the cooling cost of a data center; solves the hot spot issues within a data center due to recirculation of exhaust air; is a passive apparatus, requiring no power at the heat exchanger door, and depending on the implementation, requires no fans or control elements which would need to be purchased or replaced if failed; and creates no extra noise within the data center environment.

In view of the significant importance, from a product reliability and performance viewpoint, and from a customer satisfaction and business perspective, to achieve a substantially uniform temperature across the air inlet side of the electronics rack, disclosed herein are various further enhancements to the air-cooling apparatus and heat exchanger door configuration described above in connection with FIGS. 2A-5.

As a further cooling approach to the above-described, air-cooling heat exchanger door implementation, direct immersion-cooling of electronic components of a plurality of electronic components or subsystems within an electronics rack may be employed. Such an immersion-cooling approach would advantageously avoid forced air-cooling of the immersion-cooled components, and enable liquid-cooling of the electronics rack(s) within a data center. Where employable, the use of dielectric fluid immersion-cooling may offer several unique benefits over air-cooling.

For example, the use of a dielectric fluid that condenses at a temperature above typical outdoor ambient air temperature enables data center cooling architectures which may not require energy-intensive refrigeration chillers. Also, the use of liquid immersion-cooling may, in certain cases, allow for greater compaction of electronic components at the electronic subsystem level and/or the electronic rack level, since conductive cooling structures may be eliminated. Unlike corrosion-sensitive water-cooled systems, chemically inert dielectric coolant can be employed with an immersion-cooling approach such as described herein, which would not mandate copper as the primary thermally conductive wetted metal. Lower cost and lower mass aluminum structures could replace copper structures wherever thermally viable, and the mixed, wetted metal assemblies would not be vulnerable to galvanic corrosion, such as in a water-based cooling approach. For at least these potential benefits, dielectric fluid immersion-cooling of one or more electronic subsystems of an electronics rack or one or more components of one or more electronic systems or subsystems may offer significant energy efficiency and higher performance cooling benefits, compared with currently available air cooled systems.

In the examples discussed below, the dielectric fluid may comprise any one of a variety of commercially available dielectric coolants. For example, any of the Novec™ fluids manufactured by 3M Corporation (e.g., FC-72, FC-86, HFE-7000, and HFE-7200) could be employed. Alternatively, a refrigerant such as R-134a or R-245fa may be employed if desired.

Figure 6A:
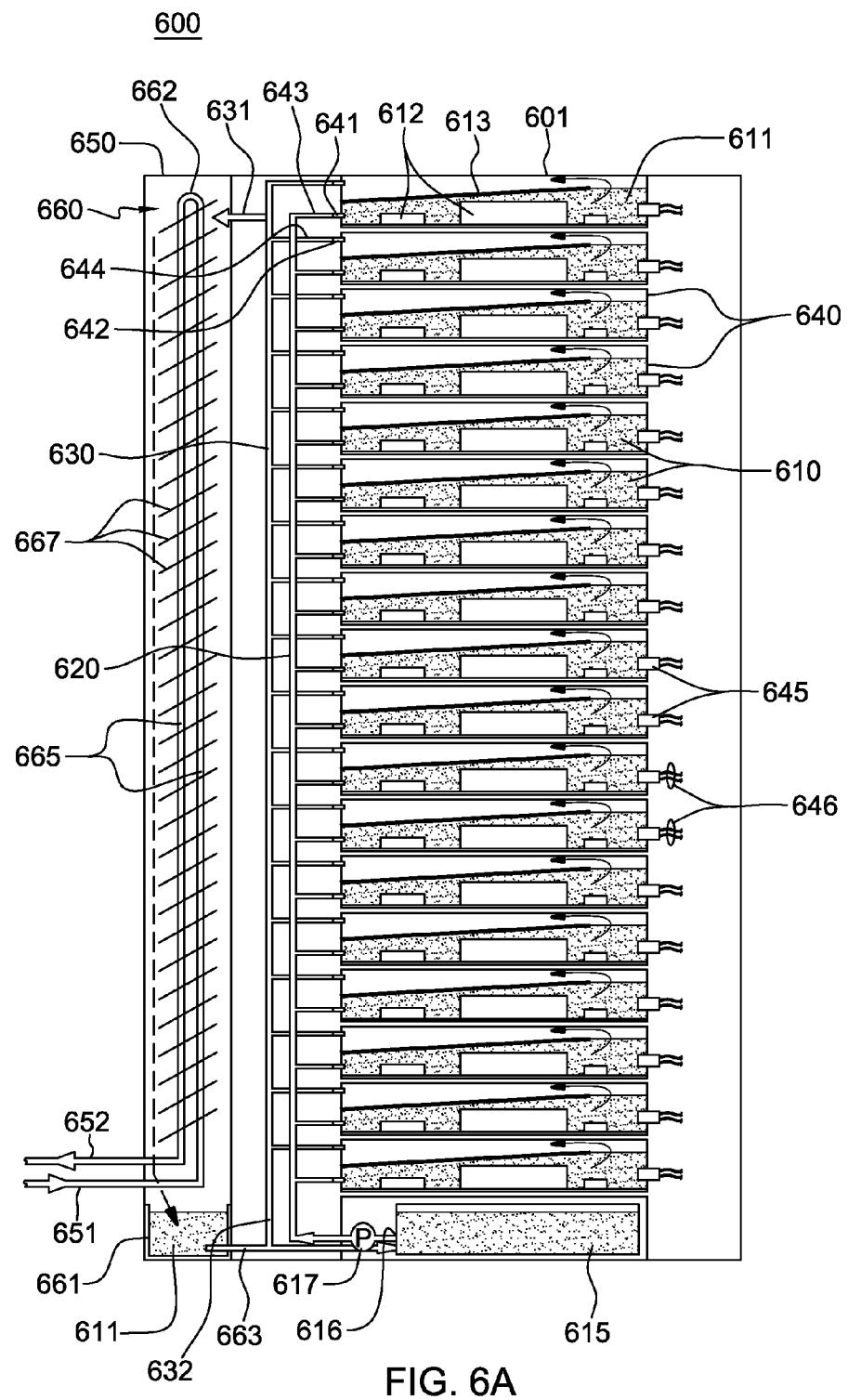
FIG. 6A is an elevational view of an alternate, immersion-cooling approach, wherein one embodiment of a liquid-cooled electronics rack is depicted comprising a plurality of horizontally-disposed, immersion-cooled electronic component sections or enclosures, in accordance with one or more aspects of the present invention.

FIG. 6A is a schematic illustration of one embodiment of a liquid-cooled electronics rack, generally denoted 600, employing immersion-cooling of electronic subsystems 610, in accordance with an aspect of the present invention. In this implementation, the plurality of immersion-cooled electronic subsystems 610 are illustrated horizontally-disposed within an electronics rack 601 so as to be essentially stacked within the rack. By way of example, each electronic subsystem 610 may be a server unit of a rack-mounted plurality of server units, and include multiple electronic components to be cooled. In one embodiment, each electronic subsystem comprises multiple different types of electronic components to be cooled having different heights and/or shapes.

Figure 6B:
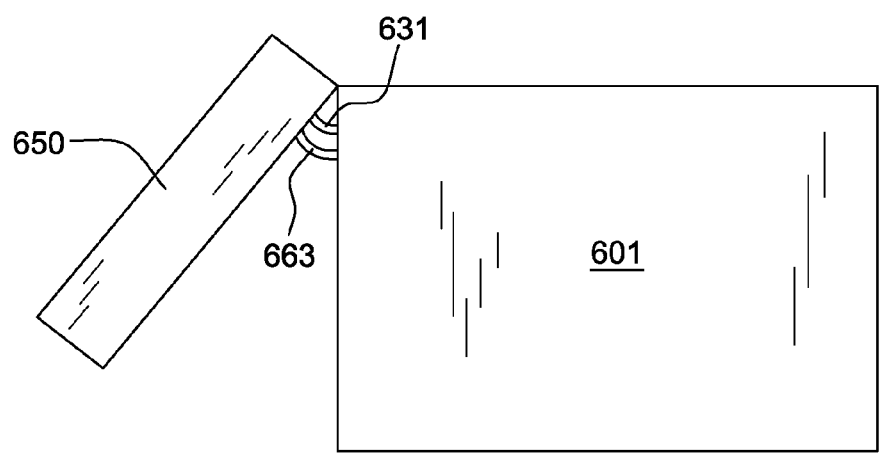
FIG. 6B is a plan view of the liquid-cooled electronics rack of FIG. 6A, showing the door assembly thereof hingedly mounted to the electronics rack, rotated partially open, and depicting the flexible dielectric fluid vapor and dielectric fluid liquid return hoses, in accordance with one or more aspects of the present invention.

Referring collectively to FIGS. 6A & 6B, the immersion-cooled electronic subsystems 610 each comprise (in one example) a housing or enclosure 640 at least partially surrounding and forming a compartment about the electronic subsystem, with the plurality of electronic components 612 of the electronic subsystem being disposed within the compartment. In one example, electronic components 612 include one or more processors and one or more dual in-line memory module (DIMM) arrays. A dielectric fluid 611 is provided within the compartment, and the plurality of electronic components to be cooled is immersed within dielectric fluid 611. A baffle 613 is provided to facilitate maintaining electronic components 612 immersed within the dielectric fluid, and to direct flow of dielectric fluid vapor generated by boiling of dielectric fluid at one or more surfaces of the electronic components towards a dielectric fluid vapor outlet 642 disposed in an upper portion of the compartment. In one embodiment, baffle 613 includes multiple openings (not shown) which facilitate drainage of any dielectric fluid in liquid state above baffle 613 back to the lower portion of the compartment, and passage of dielectric fluid vapor from the lower portion of the compartment to the upper portion of the compartment. As illustrated, the housing further includes a dielectric fluid inlet 641 through which dielectric fluid in liquid state is provided to the compartment. A dielectric fluid inlet line 643 and a dielectric fluid outlet line 644 couple to the respective dielectric fluid inlet 641 and dielectric fluid vapor outlet 642.

In an operational state, dielectric fluid 611 pools in the liquid state at the bottom of the compartment and is of sufficient volume to submerge the electronic components 612. Electronic components 612 dissipate varying amounts of power, which cause the dielectric fluid to boil, releasing a dielectric fluid vapor, which rises to the upper portion of the compartment of the housing.

One or more hermetically-sealed electrical connectors 645 are also provided in each housing 640, for example, at a back surface thereof, for docking into a corresponding electrical plane of the electronics rack in order to provide electrical and network connections 646 to the electronic subsystem disposed within the housing when the electronic subsystem is operatively positioned within the housing and the housing is operatively positioned within the electronics rack.

As illustrated in FIGS. 6A & 6B, dielectric fluid vapor lines 644 couple in fluid communication dielectric fluid vapor outlets 642 of immersion-cooled electronic subsystems 610 and a dielectric fluid vapor return manifold 630. Dielectric fluid vapor return manifold 630 in turn couples in fluid communication the dielectric fluid vapor lines 644 and a vertically-oriented, vapor-condensing unit 660. This later coupling is via at least one dielectric fluid vapor hose 631. In the embodiment of FIGS. 6A & 6B, one dielectric fluid vapor hose is illustrated (by way of example only). Further, in the embodiment depicted, vertically-oriented, vapor-condensing unit 660 is disposed within a door 650 that is hingedly mounted along one vertical edge thereof to electronics rack 601. As shown in FIG. 6B, dielectric fluid vapor hose 631 is a flexible hose which couples to the vapor-condensing unit within the door adjacent to (or near) a hinge point (or edge) of the door relative to the electronics rack.

As illustrated in FIG. 6A, vertically-oriented, vapor-condensing unit 660 comprises a tube and fin heat exchanger (i.e., vertically-oriented, vapor-condensing heat exchanger 662), which extracts heat from dielectric fluid vapor (and liquid) passing into the vertically-oriented, vapor-condensing unit 660 from dielectric fluid vapor return manifold 630 via the at least one dielectric fluid vapor hose 631. In the embodiment illustrated, one or more vertically-oriented tubes 665 of the heat exchanger are coupled in fluid communication with a facility coolant supply line 651 and a facility coolant return line 652 to allow for passage of cool facility coolant through the vertically-oriented, vapor-condensing heat exchanger 662. A plurality of sloped, thermally conductive fins 667 are, in one embodiment, in physical and/or thermal contact with the plurality of tubes 665. The vertically-oriented, vapor-condensing unit 660 cools dielectric fluid vapor (and liquid) passing into the vertically-oriented, vapor-condensing unit and produces dielectric fluid 611 condensate. This dielectric fluid condensate drops via gravity to the bottom of the vertically-oriented, vapor-condensing unit, into a condensate collector 661 disposed in the bottom of door 650, and is subsequently drained via dielectric fluid return hose 663 to a reservoir 615 in fluid communication therewith.

As illustrated, reservoir 615 is disposed (in one embodiment) in a lower portion of electronics rack 601. Reservoir 615 includes a reservoir outlet 616; and a pump 617 is coupled in fluid communication therewith. Pump 617 supplies dielectric fluid under pressure from reservoir 615 to a dielectric fluid supply manifold 620, which couples in fluid communication reservoir 615 and dielectric fluid inlets 641 of the plurality of immersion-cooled electronic subsystems 610, that is, via respective dielectric fluid supply lines 643. Note that, since principally all heat transfer in the liquid-cooled electronics rack of FIGS. 6A & 6B occurs via boiling and vapor generation, the total coolant volumetric flow rate to be provided by pump 617 is relatively small. Note that dielectric fluid 611 condensate residing in the condensate collector at the bottom of vertically-oriented, vapor-condensing unit 660 is transferred through the dielectric fluid return hose 663 to reservoir 615, and a liquid drain pipe 632 is disposed at a lower end of dielectric fluid vapor return manifold 630 for draining any dielectric fluid condensate from dielectric fluid vapor return manifold 630 to dielectric fluid return hose 663.

Note also that, in operation, facility coolant supplied to vertically-oriented, vapor-condensing heat exchanger 660 needs to be at a temperature below the saturation temperature of the dielectric fluid. By way of example, if the facility coolant is water, a temperature of about 30° C., or higher, may be employed based on the saturation temperature of the dielectric fluid within the liquid-cooled electronics rack. Such a relatively high coolant temperature means that minimum cooling power is required to provide facility coolant at the desired temperature to remove heat from the electronics rack.

In general, fluidic coupling between the electronic subsystems and the dielectric fluid manifolds and lines, as well as between the return manifold and the vapor-condensing unit, and the vapor-condensing unit and reservoir, and the facility coolant supply and return lines and the vapor-condensing heat exchanger, can be established using suitable hoses, hose barb fittings and quick disconnect couplers. In one example, the illustrated, vertically-oriented dielectric fluid vapor return and dielectric fluid supply manifolds each include ports which facilitate fluid connection of the respective components to the manifolds via flexible hoses. Respective quick connect couplings may be employed to couple flexible dielectric fluid inlet and outlet lines 643, 644 to the respective dielectric fluid inlets and vapor outlets of the immersion-cooled electronic subsystems, to (for example) allow for removal of a housing and electronic subsystem from the electronics rack. The quick connect couplings may be any one of various types of commercially available couplings, such as those available from Colder Products Company, of St. Paul, Minn., U.S.A., or Parker Hannifin, of Cleveland, Ohio, U.S.A.

Note also that the fluidic connections between the components within the electronics rack and the vertically-oriented, vapor-condensing unit disposed within the door, that is, the at least one dielectric fluid vapor hose 631 and the dielectric fluid return hose 663, at the top and bottom of the electronics rack, respectively, are flexible enough to allow the door to be readily opened and closed. FIG. 6B schematically illustrates a partially rotated open door 650 relative to the electronics rack. These hoses have sufficient length, or loop, to allow the hoses to rotate and traverse in a manner to allow the door to be opened and closed without requiring a prohibitive amount of force and without compromising the structural integrity of the joints between the hoses and the fittings on the door or the electronics rack.

The vertically-oriented, vapor-condensing unit 660 is a passive vapor-condensing unit. As noted, the unit may comprise facility coolant-carrying tubes and thermally conductive fins extending from the outer surfaces of the tubes. The thermally conductive fins 667 extending from the facility coolant-carrying tubes 665 are illustrated sloping downward to facilitate gravity-assisted drainage of condensate forming on the fin surfaces. If desired, other fin configurations, including, inverted V-shaped configurations, could be employed within the vertically-oriented, vapor-condensing unit.

In one embodiment, door 650 is fabricated of a polymeric material with insulating properties, such as Teflon™. Door 650 does not need to be a thermally conductive material. Also, since the immersion-cooled electronic subsystems are completely immersion-cooled, there is no functional need for the door (in this embodiment) to allow air to flow therethrough, and therefore, the door can be a solid door.

Since heat transfer in the liquid-cooled electronics rack embodiment of FIGS. 6A & 6B occurs using boiling and vapor generation, the total coolant volumetric flow rate required to be provided by the pump is relatively small. In addition, as noted, the facility coolant supplied to the vapor-condensing unit should be at a temperature that is below the saturation temperature of the coolant inside the immersion-cooling subsystems. For example, the facility coolant temperature may be approximately 30° C. or higher, based on the saturation temperature of the dielectric coolant inside the system. Such a relatively high coolant temperature means that minimal cooling power is required to produce the chilled facility coolant required to remove heat from the electronics rack via the vertically-oriented, vapor-condensing unit. The use of a rack door to house the vertically-oriented, vapor-condensing unit means that more of the electronics rack can be used to house immersion-cooled electronic subsystems, or other subsystems or components.

As discussed herein, electronic (or IT) racks can be cooled using a variety of approaches, including air-cooling, liquid-cooling, or immersion-cooling approaches. In the case of an air-cooled electronics rack, the use of a door-based heat exchanger can be beneficial in reducing the heat load dissipated into the data center. For instance, in the case of a rear door heat exchanger, most of the heat from the hot electronics rack exhaust air may be transferred to a liquid coolant (e.g., chilled water) circulating through the rear door heat exchanger. Such an approach can reduce the need for expensive, and energy inefficient, computer room air-conditioning units.

In an immersion-cooling approach, all of the heat generated by the electronic components within an immersion-cooled enclosure is absorbed by the circulating dielectric fluid through, for instance, vaporization of the fluid. A condenser is associated with the electronics rack to condense the vapor back to liquid, which is then cooled and re-circulated through the immersion-cooled electronic enclosure(s). Typically, the vapor-condensing is performed at the local electronic subsystem (e.g., server) level. Alternatively, a rack-level vapor condenser could be provided. Advantageously, the heat load dissipated to the computer room using an immersion-cooling approach is minimal, significantly reducing the need for computer room air-conditioning.

Despite the improved energy efficiency offered by an immersion-cooling solution, complete immersion-cooling of electronic subsystems (e.g., servers) of an electronics rack is not always viable. Certain server components, such as spinning disk drives, should be air-cooled, while other components, for instance, the hottest components (such as the processors), may be immersion-cooled, with one or more other remaining subsystem components either immersion-cooled or air-cooled. Thus, a hybrid cooling approach may be desirable, wherein only some of the heat generated at the electronic subsystem level is transferred to dielectric fluid vapor via an immersion-cooling approach, with a significant fraction also being dissipated to airflow through the electronics rack. An alternate situation may also arise with the use of mixed hardware within a single electronics rack. For example, an electronics rack could include several immersion-cooled computational subsystems, combined with several air-cooled storage subsystems. In such a case, a fraction of the heat load is again dissipated via airflow through the rack into the data canter.

In view of the above, disclosed herein is a hybrid cooling solution for an electronics rack which provides both immersion-cooling of one or more immersion-cooled electronic component sections of the rack, and air-cooling of one or more air-cooled electronic component sections of the rack. This hybrid approach is facilitated by the provision of a door assembly for the rack which provides both air-cooling and vapor-condensing functions. The door assembly may be mounted to either the air inlet side or the air outlet side of the electronics rack to either cool air ingressing into the electronics rack, or air egressing from the electronics rack, as well as to provide a vapor-condensing facility for the one or more immersion-cooled electronic component sections within the electronics rack. In one embodiment, the door assembly is a rear door assembly which is configured to mount, for example, to the air outlet side of the electronics rack. The rear door assembly may include, in one embodiment, an air-to-liquid heat exchanger configured to cool air exhausting from the electronics rack, and a vapor-condenser coupled to condense dielectric fluid vapor from the one or more immersion-cooled electronic component sections of the electronics rack. Advantageously, such a door assembly frees space within the electronics rack itself by eliminating the need for subsystem-level or rack-level vapor-condensing within the rack, and simultaneously reduces heat dissipation into the data center, thus reducing the need for computer room air-conditioning units, and in so doing, improving energy efficiency of the data center.

The cooled electronic systems and cooling apparatuses disclosed herein include a door assembly segmented into a first, air-to-coolant heat exchanger section, which allows airflow through the electronics rack to pass across the heat exchanger and transfers heat from the airflow to, for instance, facility coolant flowing through the heat exchanger, and a second, sealed vapor-condensing section which facilitates dielectric fluid vapor condensing for one or more immersion-cooled electronic component sections of the rack. In one embodiment, the vapor-condensing section is a finned section with, for instance, perforated dielectric fluid vapor-carrying tubes, and a reservoir to collect dielectric fluid condensate. Chilled facility coolant is pumped into both sections of the door assembly with distribution of facility coolant determined, for example, via a three-way proportional valve that may either be set at the factory, or at the customer site, or be continuously varied by an automated controller, depending upon the current needs of operation. For instance, the controller could implement an automated three-way proportional valve adjustment facility by (in part) monitoring, for instance, air temperature of airflow exhausting from the electronics rack, or temperature of airflow exiting from across the air-to-coolant heat exchanger, as well as temperature of dielectric fluid liquid being returned to the one or more immersion-cooled electronic component sections of the electronics rack. As explained further below, one or more coolant-conditioning units may be disposed within the electronics rack, and include one or more pumps for pumping dielectric fluid liquid from the vapor-condensing section of the door assembly to a dielectric fluid supply manifold disposed, for instance, within the electronics rack which facilitates supplying of dielectric fluid liquid to the one or more immersion-cooled electronic component sections of the rack.

Figure 7A:
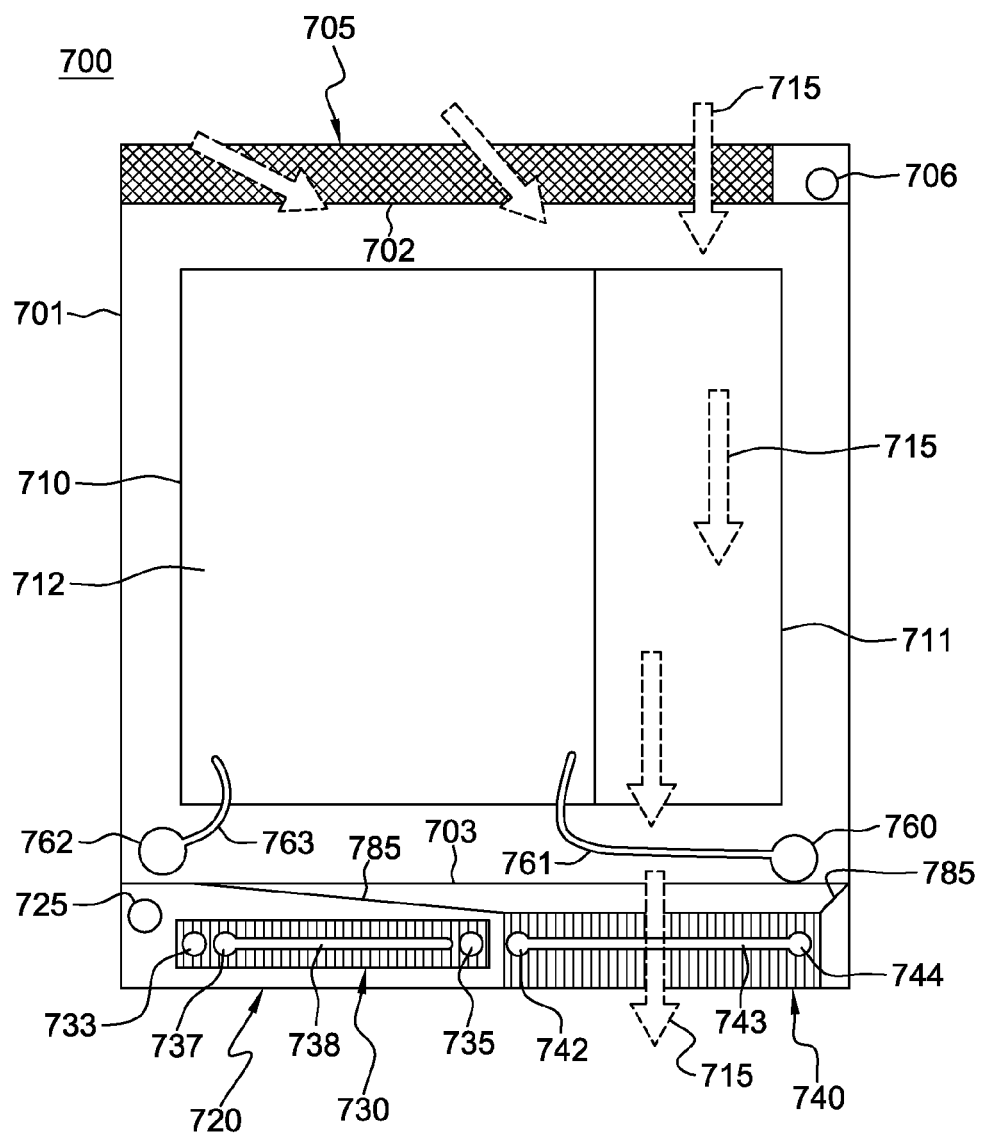
FIG. 7A is a plan view of another cooling approach, wherein an electronics rack is provided, along with a hybrid cooling apparatus comprising an air-cooling and vapor-condensing door assembly, in accordance with one or more aspects of the present invention.
Figure 7B:
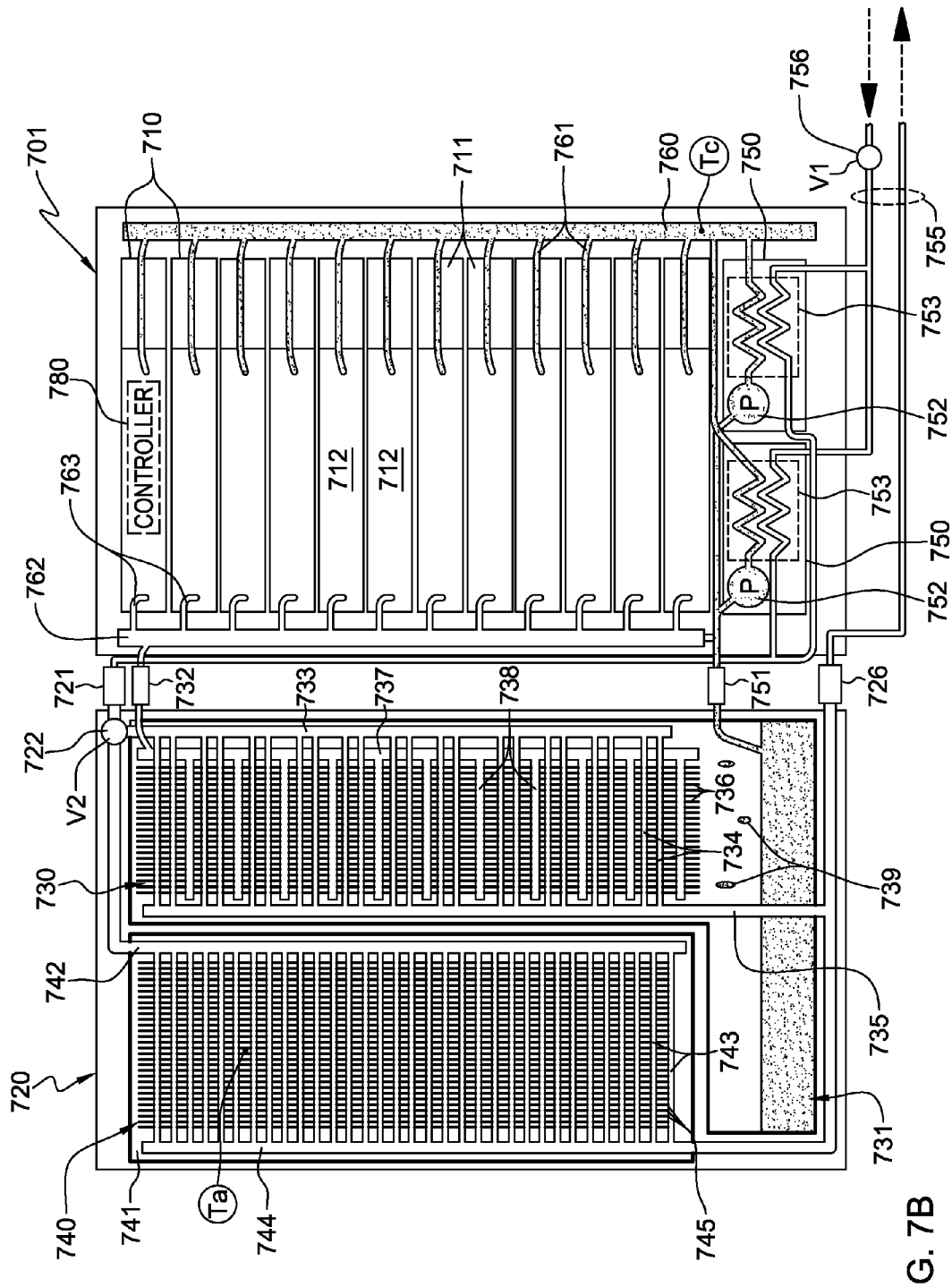
FIG. 7B is an elevational depiction of the cooled electronic system of FIG. 7A, with the air-cooling and vapor-condensing door assembly shown pivoted open, in accordance with one or more aspects of the present invention.
Figure 7C:
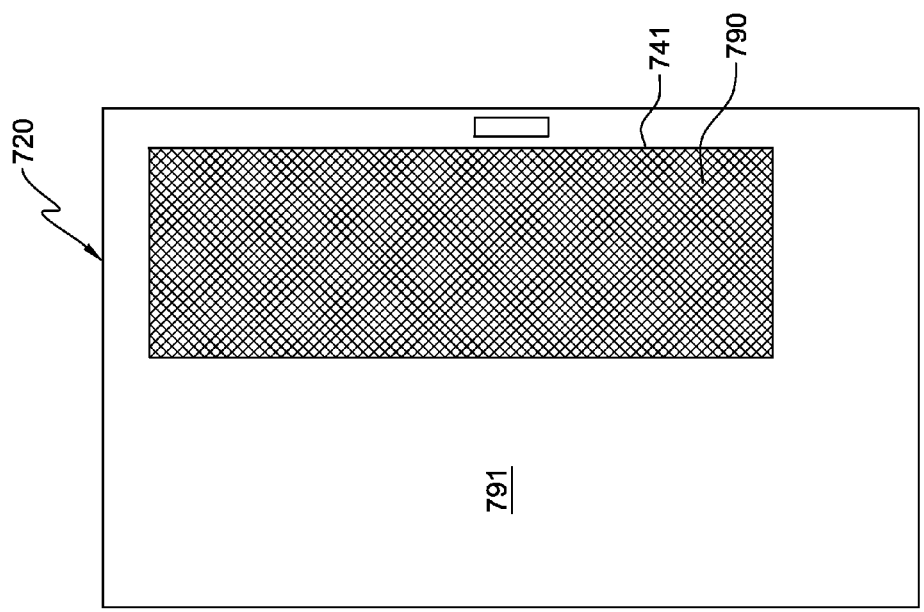
FIG. 7C is an elevational depiction of the cooled electronic system of FIGS. 7A & 7B, with the air-cooling and vapor-condensing door assembly shown pivoted closed, in accordance with one or more aspects of the present invention.
Figure 7D:
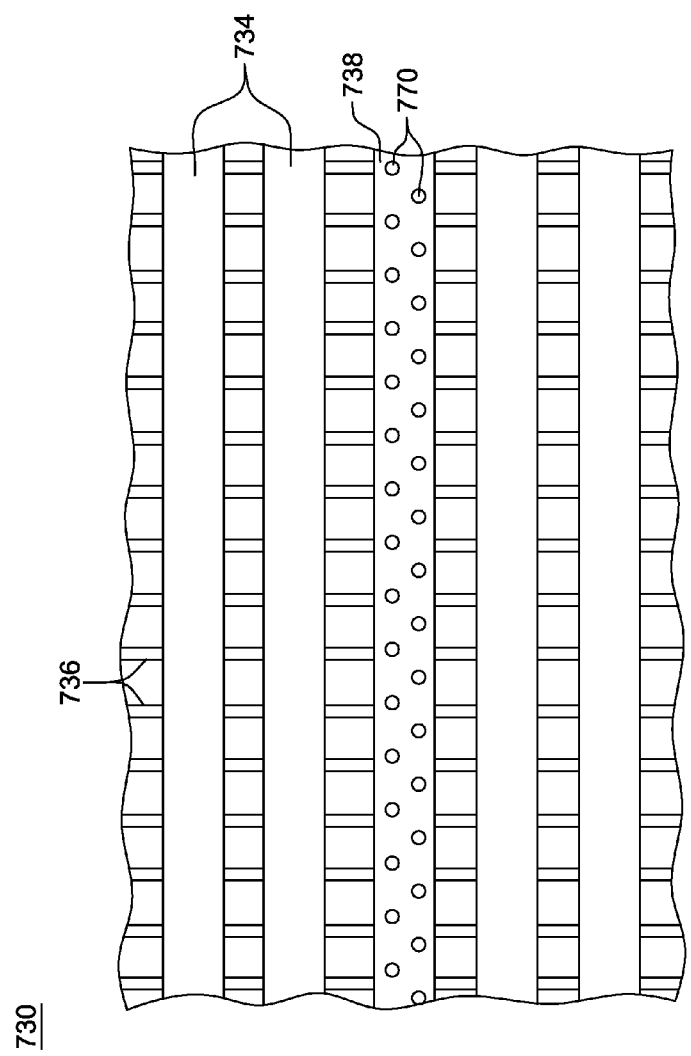
FIG. 7D is a partial enlargement of one embodiment of the vapor condenser of the air-cooling and vapor-condensing door assembly of FIGS. 7A-7C, in accordance with one or more aspects of the present invention.
Figure 8:
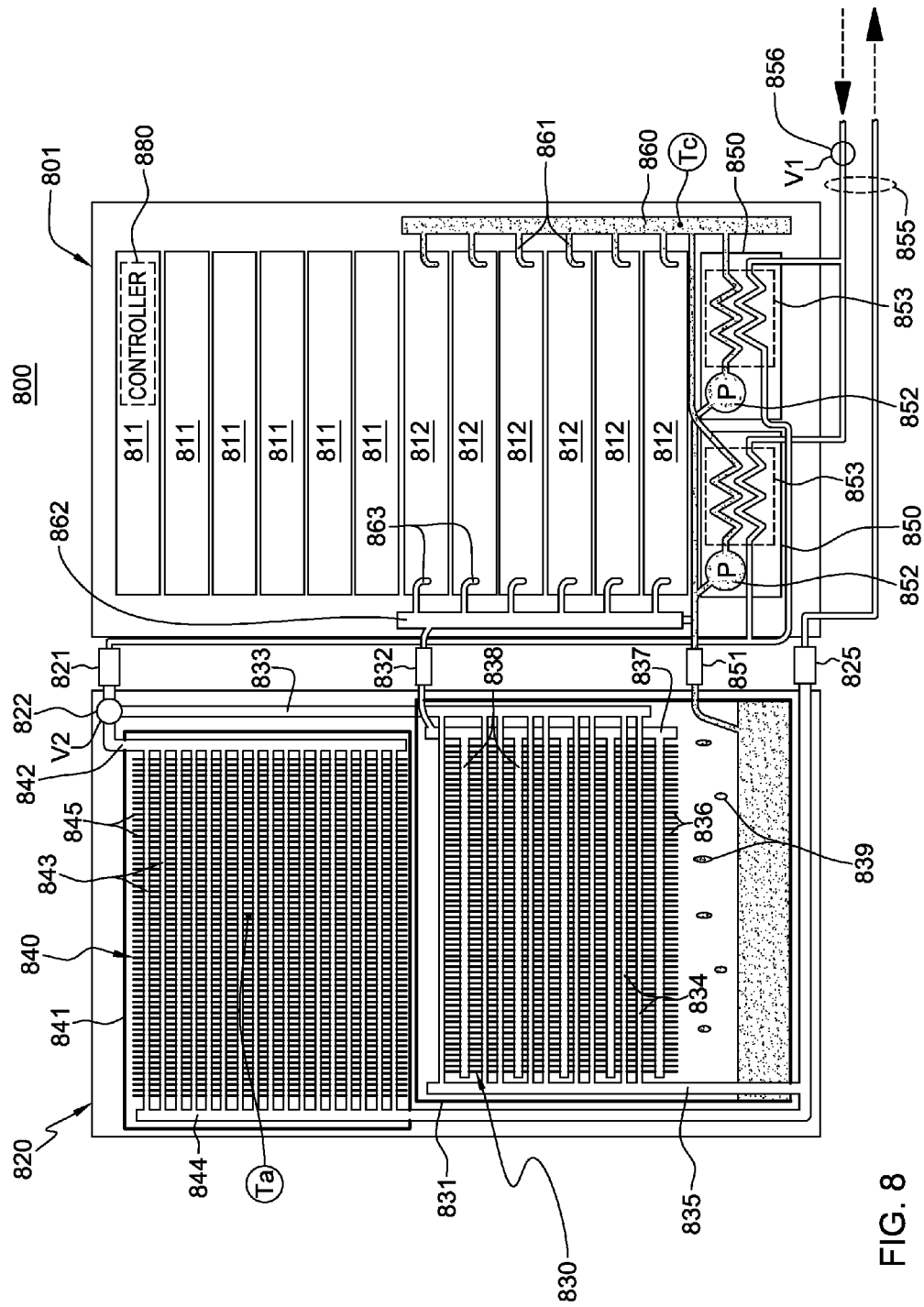
FIG. 8 is an elevational depiction of another embodiment of the hybrid cooling approach of FIGS. 7A-7D, wherein an electronics rack is depicted, along with a hybrid cooling apparatus comprising an air-cooling and vapor-condensing door assembly, which is shown pivoted open, in accordance with one or more aspects of the present invention.

Multiple embodiments of such a hybrid cooling approach are depicted in FIGS. 7A-8, and described below. This hybrid cooling approach is particularly beneficial for use with mixed cooling hardware. The first cooling embodiment of FIGS. 7A-7D has the air-cooling and vapor-condensing sections of the door assembly side-by-side within the door, and may be appropriate for use with an electronics rack which includes a plurality of electronic subsystems, multiple ones of which are partially immersion-cooled, and partially air-cooled. The second embodiment, depicted in FIG. 8, illustrates a door assembly with stacked air-cooling and vapor-condensing sections, which may be appropriate for use within an electronics rack with, for instance, one or more electronic subsystems completely air-cooled, and one or more electronic subsystems principally immersion-cooled.

There are several advantages to the hybrid cooling approach and hybrid door assembly disclosed herein, including: providing both vapor-condensing and air-cooling in a single, rack-mountable door assembly, thereby saving costs, as well as space, within the electronics rack which may otherwise have been taken up by separate rack-level or sub-system-level vapor condensers; assisting in improving energy efficiency by allowing airflow exhausting from across the air-cooled components of the rack to be cooled by an air-to-liquid heat exchanger before exiting into the data center, thus requiring less room air-conditioning; and increasing customer flexibility in configuring their electronics racks, since both a combination of air-cooling and immersion-cooling subsystems may be installed in the same electronics rack without paying a price in terms of space within the rack or in terms of increased room heating.

As noted, FIGS. 7A-7D depict one embodiment of a hybrid cooling apparatus providing both air-cooling and immersion-cooling of selected electronic components within the electronics rack. Referring collectively to FIGS. 7A-7D, in the implementation depicted, the cooled electronic system 700 includes an electronics rack 701 with a plurality of electronic subsystems 710. By way of example only, the plurality of electronic subsystems 710 are horizontally-disposed and stacked within the electronics rack 701, and the depicted electronic subsystems 710 include an air-cooled electronic component section 711, and an immersion-cooled electronic component section 712. One or more air-moving devices (not shown) are disposed within the electronic subsystems or the electronics rack to facilitate airflow 715 from an air inlet side 702 to an air outlet side 703 of electronics rack 701. This airflow 715 cools the electronic components within the air-cooled electronic component sections 711 of the electronic subsystems 710. A perforated front door 705 is, in this embodiment, hingedly mounted 706 to air inlet side 702 of electronics rack 701, and a rear door assembly 720 is mounted, for example, hingedly mounted 725, along one edge to the air outlet side 703 of electronics rack 701. As illustrated, perforated front door 705 allows for ingress of airflow 715 into the electronics rack and across the air-cooled electronic component sections 711 of the plurality of electronic subsystems 710, and rear door assembly 720 includes an air-cooling section or air-to-coolant heat exchanger 740, with an airflow opening 741 that facilitates, in the depicted example, egress of airflow 715 from the electronic rack through the door assembly. A perforated plate (or screen) 790 (FIG. 7C) may reside over airflow opening 741, adjacent to the outside surface of door assembly 720. The perforated plate or screen 790, in one embodiment, maximizes airflow through the perforated surface, while still providing a desired isolation of the underlying air-to-liquid heat exchanger 740 (see FIGS. 7A & 7B). Note that the balance of outside surface 791 of door assembly 720 comprises a substantially solid surface, at least a portion of which overlies or forms part of, the vapor-condensing section of the door assembly (described further below).

As illustrated best in FIG. 7B, the air-cooling section or air-to-coolant heat exchanger 740 comprises a facility coolant supply manifold 742, a plurality of facility coolant-carrying tubes 743, and a facility coolant return manifold 744 coupled in fluid communication to allow for the passage of facility coolant through the air-to-coolant heat exchanger 740. A plurality of thermally conductive fins 745 are coupled in thermal or mechanical contact with the plurality of facility coolant-carrying tubes 743, to facilitate the extraction of heat from airflow 715 (see FIG. 7A) passing across the air-to-coolant heat exchanger when in operation. In the embodiment illustrated, a facility coolant inlet 721 is provided, along with a facility coolant outlet 726 for rear door assembly 720. As illustrated, the facility coolant inlet and outlet facilitate flow of facility coolant through the air-cooling and vapor-condensing sections of the door assembly (via a proportional valve V2 722). The facility coolant may be provided, for instance, via a facility coolant loop 755 coupled (in one embodiment) to a facility coolant chiller (not shown). As one example, the facility coolant may comprise chilled water.

As noted, door assembly 720 further includes a vapor-condensing section comprising a vapor condenser 730 disposed within a sealed, vapor-condensing chamber 731 of the door assembly, a lower region of which acts (in this embodiment) as a reservoir for collecting dielectric liquid condensate 739 dripping from vapor condenser 730. An adjustable, three-way proportional valve 722 may be associated with facility coolant inlet 721 to direct facility coolant flow to air-to-coolant heat exchanger 740, as well as to vapor condenser 730. The vapor condenser 730 includes a facility coolant supply manifold 733 and a facility coolant return manifold 735 coupled in fluid communication via a plurality of facility coolant-carrying tubes 734. A plurality of thermally conductive condenser fins 736 are shown thermally or mechanically coupled to the plurality of facility coolant-carrying tubes 734 of vapor condenser 730 to facilitate cooling of dielectric fluid vapor within the sealed vapor-condensing chamber 731. Dielectric fluid vapor is received through a dielectric fluid vapor inlet 732, and is distributed across the vapor condenser 730 via one or more dielectric fluid vapor-carrying tubes 737, 738, multiple ones of which may comprise a plurality of openings 770 (see FIG. 7D) which facilitate distribution of the dielectric fluid vapor within or across the vapor condenser 730. In one embodiment, openings 770 may comprise holes, or even nozzles, to facilitate distribution of dielectric fluid vapor within the vapor condenser, for instance, in the region of the plurality of thermally conductive condenser fins 736 of vapor condenser 730. The openings 770 further allow for any dielectric fluid liquid that has condensed within the dielectric fluid vapor-carrying tubes 737, 738 to drip out and downwards via gravity into the reservoir in the lower portion of the sealed vapor-condensing chamber 731.

As shown in FIG. 7B, one or more coolant-conditioning units 750 (e.g. disposed in electronics rack 701) are provided, which include (in this example) at least one dielectric fluid liquid pump 752, and at least one liquid-to-liquid heat exchanger 753, with redundant coolant-conditioning units 750 being shown by way of example only. The dielectric fluid liquid pumps 752 pump dielectric fluid liquid from the reservoir in the sealed, vapor-condensing chamber 731, via a dielectric fluid outlet 751, to a dielectric fluid supply manifold 760 disposed, for instance, within electronics rack 701. Dielectric fluid supply manifold 760 is in fluid communication via dielectric fluid supply lines 761 with respective immersion-cooled electronic component enclosures of the immersion-cooled electronic component sections 712 of the plurality of electronic subsystems 710. Dielectric fluid vapor lines 763 couple in fluid communication the immersion-cooled electronic enclosures to a dielectric fluid vapor return manifold 762 disposed, for instance, within electronics rack 701. As shown, dielectric fluid vapor return manifold 762 is in fluid communication via dielectric fluid vapor inlet 732 with the one or more dielectric fluid vapor-carrying tubes 737, 738 of vapor condenser 730. In this manner, dielectric fluid liquid is supplied to the immersion-cooled electronic component sections 712 of the electronic subsystems 710, and dielectric fluid vapor is returned to the vapor condenser 730 for condensing and, in so doing, for transferring heat to the facility coolant flowing through the vapor condenser. Liquid-to-liquid heat exchangers 753 within coolant-conditioning units 750 receive, in the depicted embodiment, chilled facility coolant from facility coolant loop 755, and function to further cool the dielectric fluid liquid being pumped to dielectric fluid supply manifold 760.

In operation, dielectric fluid vapor generated by heated components within the immersion-cooled electronic component sections of the electronics rack exits the rack and enters the vapor condenser region of the door assembly, where the vapor escapes the dielectric fluid vapor-carrying tubes into the sealed vapor-condensing chamber. The dielectric fluid vapor condenses on the thermally conductive fins of the vapor condenser, which are cooled by the facility coolant flowing through the condenser. Dielectric fluid condensate drips into the reservoir in the lower region of the sealed vapor-condensing chamber, and the one or more dielectric fluid pumps pump the dielectric fluid liquid from the reservoir in the sealed vapor-condensing chamber through the one or more liquid-to-liquid heat exchangers to cool the dielectric fluid liquid before returning the dielectric fluid liquid back to the immersion-cooled electronic component sections of the rack. In the air-to-liquid heat exchanger section of the door assembly, hot exhausting airflow passes across the facility coolant-cooled fins of the air-to-coolant heat exchanger, and is cooled. The warmed facility coolant from both the air-to-coolant heat exchanger and the vapor condenser is circulated out of the door assembly and electronics rack, back to the external facility coolant loop.

As noted, facility coolant flow distribution between the air-to-coolant heat exchanger and the vapor condenser within the door assembly can be controlled via a three-way proportional valve that may be set at the factory, for instance, based on specifications of the electronic subsystems and/or electronics rack, and for instance, comparing the expected power dissipation by the immersion-cooled electronic components within the rack versus the air-cooled components. However, if variable flow control is desired, an electronic three-way proportional valve 722 and a controller 780 may be provided, as described further below with reference to FIGS. 9 & 10. The automated controller 780 or control system may be placed either within the electronics rack, or within the door assembly, or even some other external location from the rack or door. If the immersion-cooled heat load is low, the cooling system may simply circulate single-phase dielectric fluid liquid through the vapor condenser, meaning that only a small amount of facility coolant may be needed to flow through the vapor condenser region of the door assembly (in this mode), with the majority of the facility coolant flowing through the air-to-coolant heat exchanger region of the door assembly.

When heat dissipation of the air-cooled components decreases, or the heat dissipation of the immersion-cooled components increases, the three-way electronic proportional valve could be automatically adjusted to allow for more flow into the condenser region of the door assembly. The degree to which the three-way valve is incrementally adjusted could be determined, for instance, through a measurement of the power drawn by the immersion-cooled components versus the air-cooled components, or by measuring and comparing air exhaust temperature (Tao) leaving the air-cooled portion of the rack, and the dielectric coolant temperature (Tc) entering the immersion-cooled electronic component sections of the rack (as explained further below with reference to the process control of FIG. 9). Note also that a further electronic flow control valve V1 756 may also be provided to automatically control flow of facility coolant through the coolant-conditioning units 750 and the door assembly 720. Further, although not shown, flow control or proportional valve 722 could be repositioned to control a split of facility flow between the coolant conditioning units 750, plus vapor condenser 703, and the air-to-coolant heat exchanger 740.

As noted above, the vapor condenser may comprise one or more dielectric fluid vapor-carrying tubes with openings, such as holes or slots, or even nozzles, to allow dielectric fluid vapor, and any dielectric fluid liquid, to escape into the sealed vapor condenser chamber of the door assembly. Any dielectric fluid liquid drips downwards into the reservoir within the chamber, while vapor condenses on the thermally conductive fins and/or the facility coolant-carrying tubes of the vapor condenser, chilled by the facility coolant passing through the vapor condenser. In addition, note that the door assembly could be configured to include baffles or ducting 785 (FIG. 7A) within the door assembly to facilitate directing any airflow within the electronics rack through the airflow opening in the door assembly within which the air-to-coolant heat exchanger is disposed. In one embodiment, the vapor condenser region of the door assembly is sealed, and does not allow airflow to pass through that region. The ducting or baffles 785 within the door assembly 720 help to funnel any egressing airflow from the rack to the air-to-coolant heat exchanger 740 of the door assembly. This is particularly useful in cooled electronic system embodiments where the airflow components extend along the entire width of the rack, as opposed to being on only one side of the rack, as in the illustrated example of FIGS. 7A-7D.

As noted, FIG. 8 depicts an alternate embodiment of a hybrid cooling approach and cooling apparatus, wherein a door assembly, such as a rear door assembly, is designed with stacked air-cooling and vapor-condensing sections. This door assembly configuration could be appropriate for use with an electronics rack with, for instance, one or more electronic subsystems completely air-cooled, and one or more electronic subsystems principally immersion-cooled. Note, however, that the embodiment depicted is presented by way of example only.

In this implementation, a cooled electronic system 800 is provided which includes an electronics rack 801 with a plurality of electronic subsystems. By way of example, the plurality of electronic subsystems include a plurality of air-cooled electronic subsystems (or electronic component sections) 811, and a plurality of immersion-cooled electronic subsystems (or electronic component sections) 812. The electronic subsystems 811, 812 are horizontally-disposed and stacked within electronics rack 801. One or more air-moving devices (not shown) are disposed within the plurality of air-cooled electronic subsystems 811, or the electronics rack, to facilitate airflow across the components from an air inlet side to an air outlet side of the electronics rack, as described in connection with the embodiment of FIGS. 7A-7D. This airflow cools the electronic components in the air-cooled electronic component sections of the electronics rack. A perforated front door (not shown) may be hingedly mounted to the air inlet side of the electronics rack, and a rear door assembly 820 hingedly mounted to the air outlet side of the electronics rack. As explained in the example above, the perforated front door would allow for ingress of airflow into the electronics rack and across the air-cooled electronic component sections or subsystems 811, and the rear door assembly 820 includes an air-cooling section or air-to-coolant heat exchanger 840, with an airflow opening 841 that facilitates, in the depicted example, egress of airflow from the electronics rack through the rear door assembly. Note that in the elevational depiction of FIG. 8, the rear door assembly has been pivoted open, and the air outlet side of the electronics rack is shown on the right side of the figure.

As with the embodiment of FIGS. 7A-7D, the rear door assembly 820 is divided into an air-cooling section and a vapor-condensing section. The air-cooling section includes the air-to-coolant heat exchanger 840, which comprises (in one embodiment) a facility coolant supply manifold 842, a plurality of facility coolant-carrying tubes 843, and a facility coolant return manifold 844, coupled in fluid communication to allow for the passage of facility coolant through the air-to-coolant heat exchanger 840. A plurality of thermally conductive fins 845 are coupled in thermal or mechanical contact with the plurality of facility coolant-carrying tubes 843, to facilitate the extraction of heat from airflow passing across the air-to-coolant heat exchanger. In the embodiment illustrated, a facility coolant inlet 821 is provided, along with a facility coolant outlet 825, at the rear door assembly 820, which facilitates flow of facility coolant through the air-cooling and vapor-condensing sections of the door assembly. The facility coolant may be received, for instance, via a facility coolant loop 855.

Door assembly 820 further includes a vapor-condensing section comprising a vapor condenser 830 disposed within a sealed, vapor-condensing chamber 831 of the door assembly. A lower region of the sealed chamber 831 acts as a reservoir for collecting dielectric liquid condensate 839 dripping from vapor condenser 830. An adjustable, three-way proportional valve 822 may be associated with facility coolant inlet 821 to selectively direct facility coolant flow to the air-to-coolant heat exchanger 840, as well as to the vapor condenser 830. The vapor condenser 830 includes a facility coolant supply manifold 833, and a facility coolant return manifold 835, coupled in fluid communication via a plurality of facility coolant-carrying tubes 834. A plurality of thermally conductive condenser fins 836 are shown thermally or mechanically coupled to the plurality of facility coolant-carrying tubes 834 of vapor condenser 830 to facilitate cooling of dielectric fluid vapor within the sealed, vapor-condensing chamber 831. Dielectric fluid vapor is received through a dielectric fluid vapor inlet 832 and may be distributed across the vapor condenser 830 via one or more dielectric fluid vapor-carrying tubes 837, 838, multiple ones of which may comprise a plurality of openings, such as described in connection with the embodiment depicted in FIG. 7D. These openings would facilitate distribution of dielectric fluid vapor within or across the vapor condenser 830. In one embodiment, the openings may comprise holes, or even nozzles, to facilitate distribution of dielectric fluid vapor within the vapor condenser, for instance, in the region of the plurality of thermally conductive condenser fins 836 of vapor condenser 830. The openings further allow for any dielectric fluid liquid that has condensed within the dielectric fluid vapor-carrying tubes 837, 838, to drip out and downwards via gravity into the reservoir in the lower portion of the sealed, vapor-condensing chamber 831.

As with the embodiment described above in connection with FIGS. 7A-7D, FIG. 8 depicts an embodiment wherein one or more coolant-conditioning units 850 are provided within electronics rack 801. Each coolant-conditioning unit 850 includes, in this example, at least one dielectric fluid liquid pump 852, and a liquid-to-liquid heat exchanger 853. The dielectric fluid liquid pumps 852 pump dielectric fluid liquid from the reservoir in the sealed, vapor-condensing chamber 831, via a dielectric fluid outlet 851, to a dielectric fluid supply manifold 860 disposed, for instance, within electronics rack 801. Dielectric fluid supply manifold 860 is in fluid communication via dielectric fluid supply lines 861, with respective immersion-cooled electronic component enclosures of the immersion-cooled electronic component sections (or subsystems) 812 of the electronics rack. Dielectric fluid vapor lines 863 couple in fluid communication the immersion-cooled electronic component enclosures, with a dielectric fluid vapor return manifold 862 also disposed, for instance, within electronics rack 801. As shown, dielectric fluid vapor return manifold 862 is in fluid communication via dielectric fluid vapor inlet 832, with the one or more dielectric fluid vapor-carrying tubes 837, 838 of vapor condenser 830. In this manner, dielectric fluid liquid is supplied to the immersion-cooled electronic component sections of the electronics rack, and dielectric fluid vapor is returned to the vapor condenser for condensing and, in so doing, for transferring heat to the facility coolant flowing through the vapor condenser. Liquid-to-liquid heat exchangers 853 within coolant-conditioning units 850 receive, in the depicted embodiment, chilled facility coolant from facility coolant loop 855, and function to further cool the dielectric fluid liquid being pumped 852 to the dielectric fluid supply manifold 860.

Operation of the air-cooling and vapor-condensing sections of the door assembly 820 is similar to that described in connection with the door assembly of the cooling apparatus of FIGS. 7A-7D. Dielectric fluid vapor generated by heated components within the immersion-cooled electronic component sections or subsystems of the electronics rack, exits the rack and enters the vapor-condensing region of the door assembly, where the vapor escapes the dielectric fluid vapor-carrying tubes into the sealed, vapor-condensing chamber. The dielectric fluid vapor condenses on the thermally conductive fins of the vapor condenser, which are cooled by the facility coolant flowing through the condenser. Dielectric fluid condensate drips downwards into the reservoir in the lower region of the sealed, vapor-condensing chamber, and the one or more dielectric fluid pumps pump the dielectric fluid liquid from the reservoir through the one or more liquid-to-liquid heat exchangers, to cool the dielectric fluid liquid, before returning the dielectric fluid liquid back to the immersion-cooled electronic component sections of the rack. In the air-cooling section of the door assembly, hot exhausting airflow passes across the facility coolant-cooled fins of the air-to-coolant heat exchanger, and is cooled. The warmed facility coolant from both the air-to-coolant heat exchanger and the vapor condenser is circulated out of the door assembly and the electronics rack, back to (for instance) the external facility coolant loop.

In the embodiment of FIG. 8, the air-cooling section of the door assembly is disposed over the vapor-condensing section so as to align with the air-cooled electronic component sections or subsystems 811 of the rack. Note that the size of the airflow opening 841 and configuration of the air-to-liquid heat exchanger 840 may be tailored to the particular location and configuration of the air-cooled electronic component sections or subsystems 811 within the rack. That is, for instance, the air-cooling section of the door assembly may be larger or smaller, depending upon the amount of airflow passing through the electronics rack and across the air-to-coolant heat exchanger. In an alternate embodiment, where the immersion-cooled electronic component sections of the electronics rack are disposed above the air-cooled electronic component sections, the air-cooling section of the door assembly would be below the vapor-condensing section of the door assembly.

As noted, the door assembly configuration of FIG. 8 is particularly useful for mixed cooling racks where some electronic subsystems or servers are fully air-cooled, and others fully immersion-cooled. Advantageously, the air-cooling section of the door assembly is positioned to align with the air-cooled electronic component sections of the rack to facilitate airflow through the electronics rack and across the air-to-coolant heat exchanger of the air-cooling section of the door assembly. In this embodiment, the immersion-cooled electronic component sections would align to the vapor-condensing section of the door assembly.

As noted, facility coolant flow distribution between the air-to-coolant heat exchanger and the vapor condenser within the door assembly can be controlled via a proportional valve that may be set at the factory, for instance, based on specifications of the electronic subsystems and/or electronics rack and, for instance, comparing the expected power dissipation by the immersion-cooled electronic components within the rack versus the air-cooled components. If variable flow control is desired, an electronic three-way proportional valve and controller may be provided. The controller may be placed either within the electronics rack, or within the door assembly, or even some other external location from the door or rack. A control process may be provided, wherein if the immersion-cooled heat load is low, the cooling system simply circulates, for instance, single-phase dielectric liquid through the vapor condenser, meaning that only a small amount of facility coolant may be desired to flow through the vapor condenser region of the door assembly, with a majority of the facility coolant flowing through the air-to-coolant heat exchanger region of the door assembly.

When heat dissipation of the air-cooled components decreases, or the heat dissipation of the immersion-cooled components increases, the proportional valve could be automatically adjusted to allow for more facility coolant flow into the condenser region of the door assembly. The degree to which the proportional valve is incrementally adjusted could be determined, for instance, through a measurement of the power drawn by the immersion-cooled components versus the air-cooled components, or by measuring and comparing air exhaust temperature (Tao) leaving the air-cooled portion of the rack, and the dielectric coolant temperature (Tc) entering the immersion-cooled electronic component sections of the rack (as explained further below with reference to the process control of FIG. 9). Note also that a further electronic flow control valve V1 856 may also be provided to automatically control flow of facility coolant through the coolant-conditioning units 850 and the door assembly 820. Further, although not shown, flow control or proportional valve 822 could be repositioned to control a split of facility coolant flow between the coolant conditioning units 850, and vapor condenser 830, and air-to-coolant heat exchanger 840.

Figure 9:
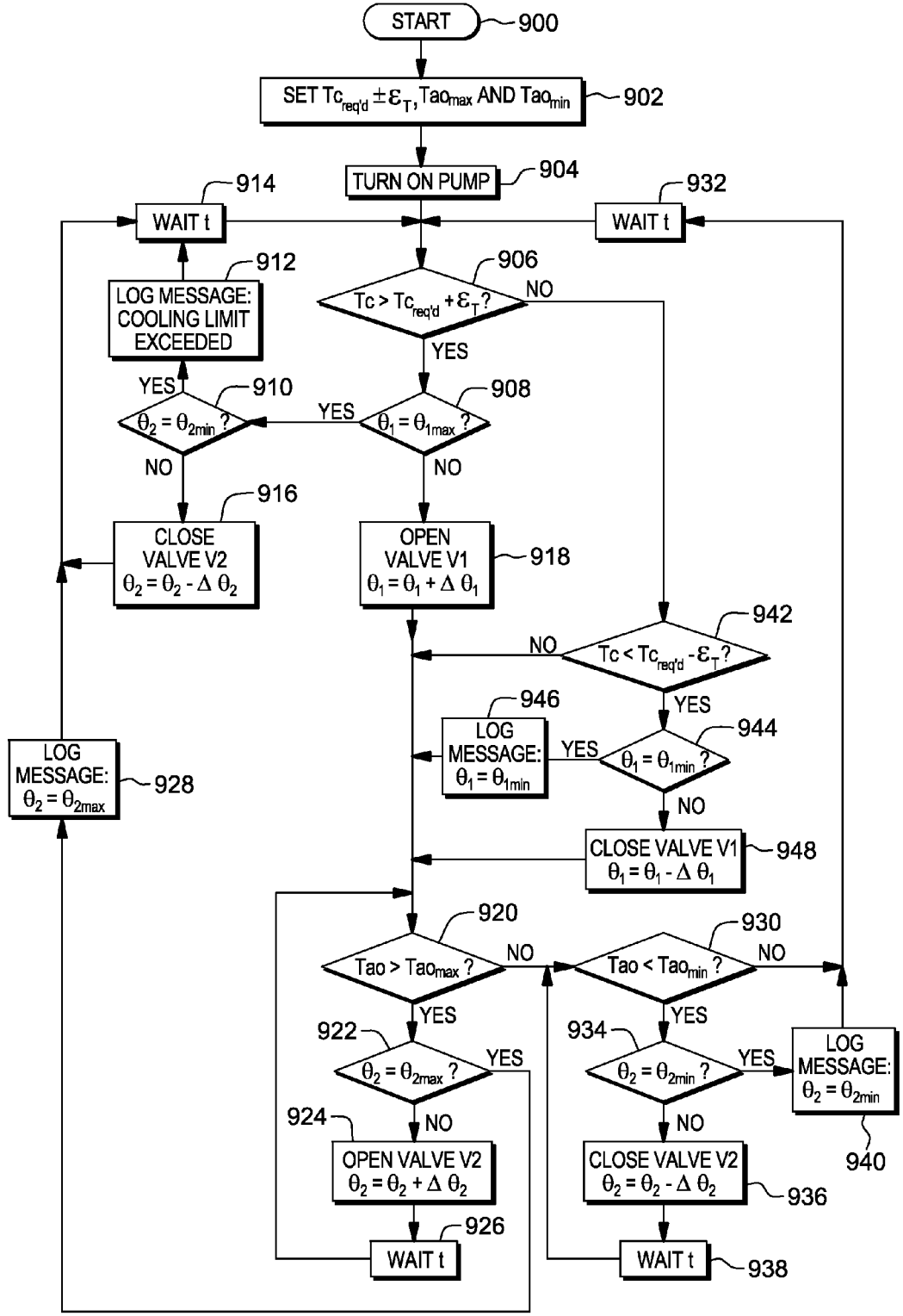
FIG. 9 depicts one embodiment of a process for automatically adjusting coolant flow within, for instance, the cooled electronic systems of FIGS. 7A-8, in accordance with one or more aspects of the present invention.

As noted, FIG. 9 depicts one embodiment of a process for automatically controlling facility coolant flow within a cooled electronic system, such as described above in connection with FIGS. 7A-8, and Table 1 describes certain variables employed in the process flow of FIG. 9.

TABLE 1

| Variable | Description |
| --- | --- |
| Tc | Current temperature of dielectric coolant entering immersion-cooled electronic component sections. |
| $Tc_{req'd}$ | Required dielectric coolant temperature |

TABLE 1-continued

| Variable | Description |
| --- | --- |
| $\epsilon_T$ | Temperature tolerance on required dielectric coolant temperature. |
| Tao | Current temperature of air exhausting from air-to-coolant heat exchanger. |
| $Tao_{min}$, $Tao_{max}$ | Minimum and maximum allowable air exhaust temperature. |
| $\theta_1$ | Current position of valve V1. |
| $\Delta\theta_1$ | Incremental change in position of valve V1. |
| $\theta_{1min}$, $\theta_{1max}$ | Minimum and maximum position of valve V1. |
| $\theta_2$ | Current position of valve V2. |
| $\Delta\theta_2$ | Incremental change in position of valve V2. |
| $\theta_{2min}$, $\theta_{2max}$ | Minimum and maximum position of valve V2. |
| t | Time. |

The process begins 900 by setting or defining an acceptable dielectric coolant temperature range ($Tc_{req'd} \pm \epsilon_T$). Additionally, the maximum and minimum allowable air exhaust temperatures ($Tao_{max}$, $Tao_{min}$), are set 902. Processing turns on one or more of the coolant-conditioning pumps 904, and determines whether the current dielectric coolant temperature (Tc) is above the acceptable temperature range 906. If "yes", processing determines whether the current setting ($\theta_1$) of flow control valve V1, at the facility coolant inlet line, is at a maximum setting ($\theta_{1max}$) for valve V1 908, and if "yes", determines whether the current setting ($\theta_2$) of valve V2, for instance, at the facility coolant inlet to the door assembly, is at a defined minimum setting ($\theta_{2min}$) for valve V2 910, meaning that a maximum amount of facility coolant is passing through the vapor condenser. If so, processing logs a message that the cooling limit has been exceeded 912, and waits a time interval t 914, before again determining whether the dielectric coolant temperature (Tc) is above the defined acceptable temperature range 906. If "no", valve V2 is incrementally ($\Delta\theta_2$) closed 916, and after waiting a time interval t 914, processing determines whether the dielectric coolant temperature (Tc) is above the acceptable temperature range 906.

Assuming that the current valve setting ($\theta_1$) for valve V1 is other than at the maximum position, then processing opens valve V1 by an incremental amount ($\Delta\theta_1$) 918, and then determines whether the current temperature of air exhausting from the air-to-coolant heat exchanger (Tao) is greater than the maximum allowable air exhaust temperature ($Tao_{max}$) 920. If "yes", then processing determines whether the current setting ($\theta_2$) of valve V2 is at the maximum setting ($\theta_{2max}$) for valve V2 922, and if "no", opens valve V2 by an incremental amount ($\Delta\theta_2$) 924, before waiting a time interval t 926, and again determining whether the current temperature of air exhausting from across the air-to-coolant heat exchanger (Tao) exceeds the maximum allowable air exhaust temperature ($Tao_{max}$). If the current setting ($\theta_2$) for valve V2 reaches the maximum ($\theta_{-2max}$) for valve V2, then processing logs a message that valve position ($\theta_2$) is at its maximum 928, and waits time interval t 914 before determining whether the current dielectric coolant temperature (Tc) is within the defined temperature range.

Assuming that the current temperature of air exhausting from the air-to-coolant heat exchanger (Tao) is less than or equal to the maximum defined allowable air exhaust temperature ($Tao_{max}$), then processing determines whether the current temperature of air exhausting from the air-to-coolant heat exchanger (Tao) is less than a minimum allowable air exhaust temperature ($Tao_{min}$) 930, and if "no", waits a time interval t 932 before again determining whether the current dielectric coolant temperature (Tc) exceeds the defined allowable temperature range.

Assuming that the current temperature exhausting from the air-to-coolant heat exchanger (Tao) is below the minimum allowed air exhaust temperature (Tao$_{min}$), then processing determines whether the current setting ($\theta_2$) of valve V2 is at the minimum ($\theta$-$_{2min}$) for valve V2 934, and if "yes", logs a message that the current position ($\theta_2$) is at the minimum for valve V2 940, before waiting time interval t 932, and repeating the process.

Assuming that the current position ($\theta_2$) of valve V2 is other than at the minimum setting, then valve V2 is incrementally closed ($\Delta\theta_2$) 936, after which processing waits a time interval t 938 before returning to determine whether the current temperature of air exhausting from the air-to-coolant heat exchanger (Tao) remains below the acceptable minimum level.

Returning to inquiry 906, assuming that the current dielectric coolant temperature (Tc) is less than or equal to the upper acceptable temperature (Tc$_{req'd}$+$\in_T$), processing determines whether the current dielectric temperature (Tc) is below the lower acceptable temperature (Tc$_{req'd}$-$\in_T$), represented by the required dielectric coolant temperature (Tc$_{req'd}$) minus the temperature tolerance ($\in_T$) 942. If "no", then processing evaluates the current temperature of air exhausting from the air-to-coolant heat exchanger (Tao) 920, as described above. If the current dielectric coolant temperature (Tc) entering the immersion-cooled portions of the rack is less than the desired temperature range, processing determines whether the current setting ($\theta_1$) of valve V1 is at the minimum position ($\theta_{1min}$) 944. If "yes", then a message is logged that the current setting of valve V1 is at the minimum position 946. If the current position ($\theta_1$) of valve V1 is other than at the minimum, then valve V1 is incrementally ($\Delta\theta_1$) closed 948, and processing proceeds to evaluate the current temperature of air exhausting from the air-to-coolant heat exchanger (Tao), as described above.

As will be appreciated by one skilled in the art, one or more control aspects of the present invention may be embodied as a system, method or computer program product. Accordingly, one or more control aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, one or more control aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Figure 10:
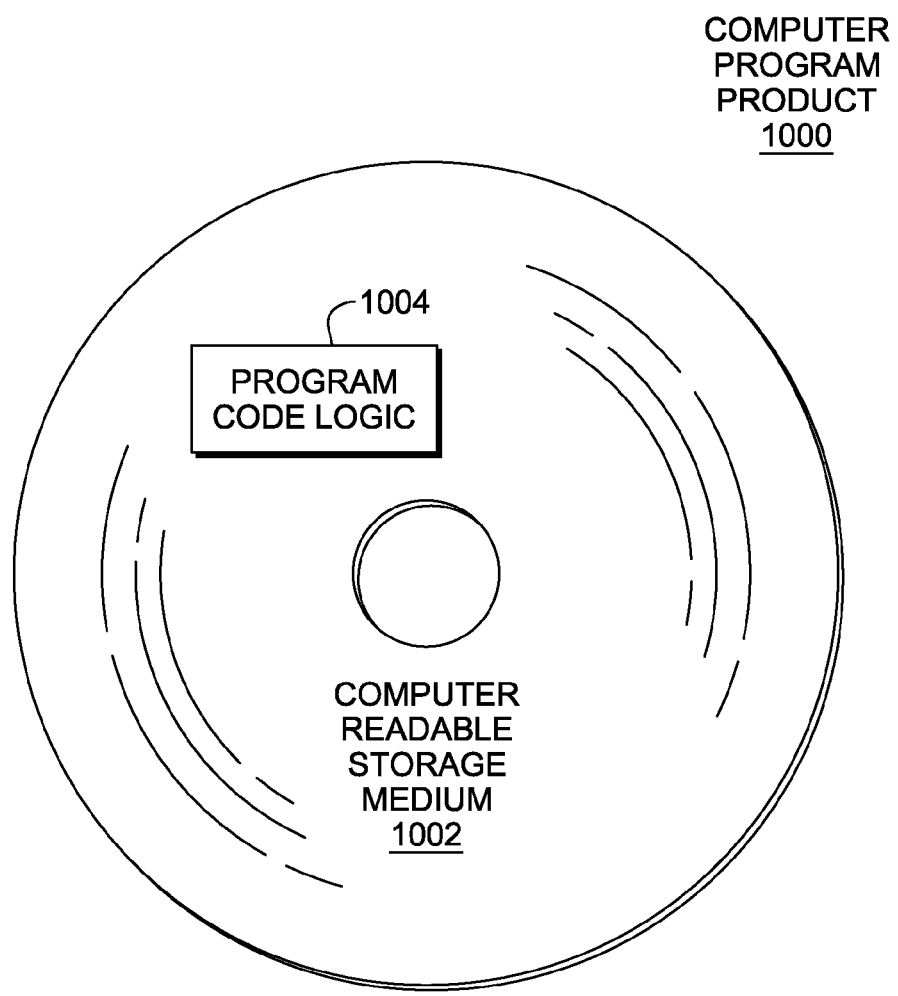
FIG. 10 depicts one embodiment of a computer program product incorporating one or more aspects of the present invention.

Referring now to FIG. 10, in one example, a computer program product 1000 includes, for instance, one or more non-transitory computer readable storage media 1002 to store computer readable program code means or logic 1004 thereon to provide and facilitate one or more control aspects of the present invention.

Program code embodied on a computer readable medium may be transmitted using an appropriate medium, including but not limited to, wireless, wireline, optical fiber cable, RF, etc., or any suitable combination of the foregoing.

Computer program code for carrying out operations for one or more aspects of the present invention may be written in any combination of one or more programming languages, including an object oriented programming language, such as Java, Smalltalk, C++ or the like, and conventional procedural programming languages, such as the "C" programming language, assembler or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

One or more control aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of one or more control aspects of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In addition to the above, one or more control aspects of the present invention may be provided, offered, deployed, managed, serviced, etc. by a service provider who offers management of customer environments. For instance, the service provider can create, maintain, support, etc. computer code and/or a computer infrastructure that performs one or more control aspects of the present invention for one or more customers. In return, the service provider may receive payment from the customer under a subscription and/or fee agreement, as examples. Additionally or alternatively, the service provider may receive payment from the sale of advertising content to one or more third parties.

In one aspect of the present invention, an application may be deployed for performing one or more control aspects of the present invention. As one example, the deploying of an application comprises providing computer infrastructure operable to perform one or more aspects of the present invention.

As a further aspect of the present invention, a computing infrastructure may be deployed comprising integrating computer readable code into a computing system, in which the code in combination with the computing system is capable of performing one or more aspects of the present invention.

As yet a further aspect of the present invention, a process for integrating computing infrastructure comprising integrating computer readable code into a computer system may be provided. The computer system comprises a computer readable medium, in which the computer medium comprises one or more aspects of the present invention. The code in combination with the computer system is capable of performing one or more aspects of the present invention.

Although various embodiments are described above, these are only examples. Further, other types of computing environments can benefit from one or more aspects of the present invention.

As a further example, a data processing system suitable for storing and/or executing program code is usable that includes at least one processor coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to explain the principles of the invention and the practical application, and to enable others of ordinary skill in the art to understand the invention through various embodiments and the various modifications thereto which are dependent on the particular use contemplated.

What is claimed is:

1. A method comprising:
providing a cooling apparatus comprising a door assembly sized to couple to an electronics rack and be disposed at one of an air inlet side or an air outlet side of the electronics rack, wherein air moves through the electronics rack from the air inlet side to the air outlet side thereof, the door assembly facilitating cooling of one or more electronic components of the electronics rack, and wherein the door assembly comprises:
an airflow opening facilitating ingress or egress of airflow through the electronics rack with the door assembly mounted thereto;
an air-to-coolant heat exchanger disposed so that airflow through the airflow opening passes across the air-to-coolant heat exchanger, the air-to-coolant heat exchanger to extract heat from the airflow passing thereacross; and
a vapor condenser, the vapor condenser being part of the door assembly, and facilitating condensing of dielectric fluid vapor egressing from at least one immersion-cooled electronic component section of the electronics rack with the door assembly mounted to the electronics rack and the vapor condenser connected in fluid communication with the immersion-cooled electronic component section of the electronics rack.

2. The method of claim 1, wherein the door assembly further comprises at least one facility coolant inlet coupled to receive facility coolant, wherein the facility coolant received via the at least one facility coolant inlet cools the air-to-coolant heat exchanger, and cools the vapor condenser.

3. The method of claim 1, wherein the door assembly further comprises a facility coolant inlet coupled to receive facility coolant, the facility coolant cooling the air-to-coolant heat exchanger, and cooling the vapor condenser, and wherein the cooling apparatus further comprises a diverter valve associated with the facility coolant inlet for selectively directing received facility coolant to at least one of the air-to-coolant heat exchanger or the vapor condenser.

4. The method of claim 2, wherein the air-to-coolant heat exchanger further comprises a first plurality of facility coolant-carrying tubes, and a first plurality of thermally conductive fins coupled to the first plurality of facility coolant-carrying tubes, and wherein the vapor condenser comprises a second plurality of facility coolant-carrying tubes and a second plurality of thermally conductive fins coupled to the second plurality of facility coolant-carrying tubes.

5. The method of claim 1, wherein the vapor condenser is disposed within a vapor-condensing chamber of the door assembly, and wherein the vapor-condensing chamber further comprises a reservoir, the reservoir receiving dielectric fluid condensate dripping from the vapor condenser.

6. The method of claim 5, further comprising:
   a dielectric fluid supply manifold in fluid communication with at least one dielectric fluid inlet of the at least one immersion-cooled electronic component section of the electronics rack; and
   at least one pump coupled in fluid communication with the reservoir for pumping, under pressure, dielectric fluid liquid from the reservoir to the dielectric fluid supply manifold, for supplying dielectric fluid liquid to the at least one immersion-cooled electronic component section of the electronics rack.

7. The method of claim 6, further comprising providing at least one coolant-conditioning unit associated with the electronics rack, the at least one coolant-conditioning unit comprising at least one liquid-to-liquid heat exchanger, the at least one liquid-to-liquid heat exchanger facilitating transfer of heat from dielectric fluid liquid, pumped by the at least one pump from the reservoir to the dielectric fluid supply manifold, to facility coolant within a facility coolant path passing, in part, through the at least one coolant-conditioning unit.

8. The method of claim 7, wherein the facility coolant, after passing through the at least one liquid-to-liquid heat exchanger, passes through at least one facility coolant inlet of the door assembly to facilitate extracting heat from the airflow passing across the air-to-coolant heat exchanger and facilitate condensing of the dielectric fluid vapor at the vapor condenser.

9. The method of claim 1, wherein the vapor condenser further comprises at least one dielectric fluid vapor-carrying tube with a plurality of openings therein which facilitate escape of dielectric fluid vapor from the at least one dielectric fluid vapor-carrying tube, wherein the at least one dielectric fluid vapor-carrying tube facilitates distribution of the dielectric fluid vapor across the vapor condenser.

10. The method of claim 1, wherein the electronics rack comprises at least one air-cooled electronic component section and the at least one immersion-cooled electronic component section, the at least one immersion-cooled electronic component section comprising at least one immersion-cooled electronics enclosure, and with the door assembly mounted to the electronics rack, the airflow opening of the door assembly is disposed, at least in part, to facilitate airflow across the at least one air-cooled electronic component section of the electronics rack.

\* \* \* \* \*